United States Patent
Fukunaga (10) Patent No.: US 6,816,524 B2
(45) Date of Patent: Nov. 9, 2004

(54) INGAASP OR INGAAS SEMICONDUCTOR LASER ELEMENT IN WHICH NEAR-EDGE PORTION OF ACTIVE LAYER IS SUBSTITUTED WITH GAAS OPTICAL WAVEGUIDE LAYER HAVING GREATER BANDGAP THAN ACTIVE LAYER

(75) Inventor: Toshiaki Fukunaga, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/232,612

(22) Filed: Sep. 3, 2002

(65) Prior Publication Data

US 2003/0043873 A1 Mar. 6, 2003

(30) Foreign Application Priority Data

Sep. 5, 2001 (JP) ......................................... 2001-269087

(51) Int. Cl.[7] ................................................ H01S 5/00
(52) U.S. Cl. ............................. 372/43; 372/44; 372/45; 372/46
(58) Field of Search ...................................... 372/43–46

(56) References Cited

U.S. PATENT DOCUMENTS

| | | | | |
|---|---|---|---|---|
| 5,363,392 A | * | 11/1994 | Kasukawa et al. | 372/45 |
| 5,375,133 A | * | 12/1994 | Mori et al. | 372/45 |
| 5,926,493 A | * | 7/1999 | O'Brien et al. | 372/45 |
| 6,023,484 A | * | 2/2000 | Matsumoto et al. | 372/46 |
| 6,567,444 B2 | * | 5/2003 | Hayakawa | 372/45 |

FOREIGN PATENT DOCUMENTS

JP    P2001-168458 A    *  6/2001    ............. H01S/5/16

OTHER PUBLICATIONS

IEEE Journal of Selected Topics in Quantum Electronics, "Reliability Improvement of 980–nm Laser Diodes with a New Facet Passivation Process" vol. 5, No. 3, May/Jun. 1999, pp. 832–pp. 838.

Abstracts of the Spring Meeting of the Japan Society of Applied Physics, "0.98$\mu$m Ridge–Waveguide LDs with Window Structure Fabricated by Quantum well Disordering" 1997, 29a–PA–19.

* cited by examiner

Primary Examiner—Wilson Lee
Assistant Examiner—Leith A Al-Nazer
(74) Attorney, Agent, or Firm—Sughrue Mion, PLLC (57) ABSTRACT

In a semiconductor laser element, a lower cladding layer of a first conductive type, a GaAs first optical waveguide layer of the first conductive type or an undoped type, an InGaAsP or InGaAs compressive-strain active layer, a GaAs second optical waveguide layer of a second conductive type or an undoped type, and an upper cladding portion are formed on a GaAs substrate of the first conductive type. The active layer is not formed in at least one vicinity of at least one end facet, and the space in the at least one vicinity of the at least one end facet is filled with a third optical waveguide layer of the second conductive type or an undoped type, where the bandgaps of the first, second, and third second optical waveguide layers are greater than the bandgap of the active layer.

18 Claims, 8 Drawing Sheets

INGAASP OR INGAAS SEMICONDUCTOR LASER ELEMENT IN WHICH NEAR-EDGE PORTION OF ACTIVE LAYER IS SUBSTITUTED WITH GAAS OPTICAL WAVEGUIDE LAYER HAVING GREATER BANDGAP THAN ACTIVE LAYER

BACKGROUND OF THE INVENTION

1. Field of the Invention

The present invention relates to a semiconductor laser element having a window structure in a vicinity of an end facet.

2. Description of the Related Art

In semiconductor laser elements, currents generated by optical absorption in vicinities of end facets generate heat, i.e., raise the temperature at the end facets. Then, the raised temperature reduces the semiconductor bandgaps at the end facets, and therefore the optical absorption is further enhanced. That is, a vicious cycle is formed, and the end facets are damaged. This is the so-called catastrophic optical mirror damage (COMD). Thus, the maximum optical output power of the semiconductor laser elements is limited by the COMD. The optical output power level (COMD level), at which the COMD occurs, is lowered with, degradation of the end facet and the like caused by aging. Therefore, the COMD occurs in the end, and the semiconductor laser elements may suddenly break down.

In order to suppress the COMD, semiconductor laser elements having a window structure have been proposed, where the window structure suppresses optical absorption at a resonator face. For example, Kazushige Kawasaki et al. ("0.98 μm band ridge-type window structure semiconductor laser (1)," Abstracts of the Spring Meeting of the Japan Society of Applied Physics, 1997, 29a-PA-19) disclose a semiconductor laser element which emits laser light in the 980 nm band and has a window structure. The window structure is formed by injecting Si ions into near-edge regions of a ridge structure and disordering an In0.2Ga0.8As quantum well by thermal diffusion. However, the process for producing this semiconductor laser element is very complicated and long since the vicinities of end facets are required to be insulated by injection of H ions in order to prevent a current flow in the vicinities of the end facets.

On the other hand, in order to suppress variations due to aging in the resonator faces of a semiconductor laser element, semiconductor laser elements having processed end facets have been proposed. For example, H. Horie et al. (in "Reliability improvement of 980-nm laser diodes with a new facet passivation process," IEEE Journal of Selected Topics in Quantum Electronics, Vol. 5 (1999), No. 3, pp. 832–838) disclose a semiconductor laser element having an internal current confinement structure and emitting laser light in the 980 nm band. The semiconductor laser element comprises an InGaAs active layer, GaAs optical waveguide layers, AlGaAs cladding layers, and an AlGaAs current confinement layer. In addition, cleaved end facets are irradiated with Ar ions having energy not higher than 35 eV, and coated with silicon by evaporation. Then, AR/HR coatings are realized on the end facets by an ion assist evaporation method, where the average acceleration voltage for Ar ions is 110 eV. Thus, this semiconductor laser element can achieve high output power and reliability. Further, Horie et al. report that when the temperature is lowered during growth of the GaAs lower cladding layer, and the InGaAs active layer is grown at low temperature, the quality is improved. However, in order to produce this semiconductor laser element, the low-energy ion acceleration requires expensive equipment.

SUMMARY OF THE INVENTION

The object of the present invention is to provide a semiconductor laser element which is reliable in operation with high output power, and can be produced by a relatively simple process without using expensive equipment.

According to the present invention, there is provided a semiconductor laser element having opposite end facets which realize a resonator, comprising: a substrate of GaAs of a first conductive type; a lower cladding layer of the first conductive type, formed above the GaAs substrate; a first optical waveguide layer being made of GaAs of the first conductive type or an undoped type, having a first bandgap, and being formed above the lower cladding layer; an active layer being made of one of InGaAsP and InGaAs, having a compressive strain and a second bandgap smaller than the first bandgap, and being formed above the first optical waveguide layer so as to leave at least one first space in at least one first vicinity of at least one of the opposite end facets; a second optical waveguide layer being made of GaAs of a second conductive type or an undoped type, having a third bandgap greater than the second bandgap, and being formed above the active layer; a third optical waveguide layer being made of GaAs of the second conductive type or an undoped type, having a fourth bandgap greater than the second bandgap, and filling the at least one first space; and an upper cladding portion formed above the second optical waveguide layer.

That is, the semiconductor laser element according to the present invention comprises the GaAs optical waveguide layers, and the active layer does not exist in at least one vicinity of at least one of the opposite end facets, and the at least one space produced in the at least one vicinity of the at least one of the opposite end facets is filled with the GaAs optical waveguide layer. Thus, a so-called window structure is formed.

In addition, it is preferable that the above window structure is formed in vicinities of both of the opposite end facets.

Further, the upper cladding portion may be constituted by either a single layer or multiple layers.

Preferably, the semiconductor laser element according to the present invention may also have one or any possible combination of the following additional features (i) to (xi).

(i) The active layer may be made of $In_{x3}Ga_{1-x3}As_{1-y3}P_{y3}$, where $0.49y3 < x3 \leq 0.4$ and $0 \leq y3 \leq 0.1$. That is, when $y3=0$, the active layer is made of InGaAs, which does not contain P.

(ii) The semiconductor laser element according to the present invention may further comprise: a contact layer of the second conductive type formed above the upper cladding portion so as to leave at least one second space in at least one second vicinity of the at least one of the opposite end facets; and an electrode formed on the contact layer. The electrode is one of a pair of electrodes which are normally provided in the semiconductor laser element.

(iii) The semiconductor laser element having the feature (ii) may further comprise an insulation film formed in the at least one second space above the upper cladding portion, and the electrode is formed on the insulation film as well as the contact layer.

(iv) In the semiconductor laser element according to the present invention, the upper cladding portion may include a ridge portion which has a stripe form and extends between the opposite end facets, where the top of the ridge portion is higher in elevation than both sides of the ridge portion of the upper cladding portion. Alternatively, an index-guided structure may be realized by an internal current confinement structure, which is specifically realized as in the following features (v) to (x).

(v) In the semiconductor laser element according to the present invention, the upper cladding portion may comprise: a first etching stop layer made of GaAs of the second conductive type; a second etching stop layer being made of $In_{x8}Ga_{1-x8}P$, having a first stripe opening for current injection and being formed above the first etching stop layer, where $0 \leq x8 \leq 1$; a current confinement layer being made of $Ga_{1-z2}Al_{z2}As$ of the first conductive type, having a second stripe opening for current injection, and being formed above the second etching stop layer; a cap layer being made of GaAs, having a third stripe opening for current injection, and being formed above the current confinement layer; and a first upper cladding layer of the second conductive type formed above the cap layer. The first, second, and third stripe openings extend between the opposite end facets.

(vi) In the semiconductor laser element according to the present invention, the upper cladding portion may comprise; a first etching stop layer made of $In_{x8}Ga_{1-x8}P$ of the second conductive type, where $0 \leq x8 \leq 1$; a second etching stop layer being made of GaAs, having a first stripe opening for current injection, and being formed above the first etching stop layer; a current confinement layer being made of $In_{0.49}(Ga_{1-z4}Al_{z4})_{0.51}P$ of the first conductive type, having a second stripe opening for current injection, and being formed above the second etching stop layer, where $0 \leq z4 < 1$; a cap layer being made of $In_{0.49}Ga_{0.51}P$ of the first conductive type, having a third stripe opening for current injection, and being formed above the current confinement layer; and a first upper cladding layer of the second conductive type formed above the cap layer. The first, second, and third stripe openings extend between the opposite end facets.

(vii) In the semiconductor laser element having the feature (v) or (vi), the lower cladding layer and the first upper cladding layer may be made of one of AlGaAs, InGaAlP, and InGaAlAsP which lattice-matches with the substrate.

(viii) In the semiconductor laser element having the feature (v) or (vi), the upper cladding portion further may comprise a second upper cladding layer of the second conductive type formed under the first etching stop layer.

(ix) In the semiconductor laser element according to the present invention, the upper cladding portion may comprise; a first upper cladding layer being made of $In_{0.49}Ga_{0.51}P$ of the second conductive type; an etching stop layer being made of GaAs, having a first stripe opening for current injection, and being formed above the first upper cladding layer; a current confinement layer being made of $In_{0.49}(Ga_{1-z4}Al_{z4})_{0.51}P$ of the first conductive type, having a second stripe opening for current injection, and being formed above the etching stop layer, where $0 \leq z4 \leq 1$; a cap layer being made of $In_{0.49}Ga_{0.51}P$, having a third stripe opening for current injection, and being formed above the current confinement layer; and a second upper cladding layer of the second conductive type formed above the cap layer. The first, second, and third stripe openings extend between the opposite end facets.

(x) In the semiconductor laser element having the feature (viii) or (ix), the lower cladding layer, the first upper cladding layer, and the second upper cladding layer may be made of one of AlGaAs, InGaAlP, and InGaAlAsP which lattice-matches with the substrate.

(xi) The semiconductor laser element according to the present invention may further comprise tensile-strain barrier layers respectively formed between the first optical waveguide layer and the active layer and between the active layer and the second optical waveguide layer and made of $In_{x4}Ga_{1-x4}As_{1-y4}P_{y4}$, where $0 \leq x4 \leq 0.49y4$ and $0 \leq y4 \leq 0.5$.

The present invention has the following advantages.

(a) As mentioned before, according to the present invention, the window structure, i.e., a region transparent to oscillated light, is formed in at least one vicinity of at least one of least one of the opposite end facets. Therefore, it is possible to reduce heat generation in the at least one vicinity of at least one of the least one of the opposite end facets, and significantly raise the COMD level. Thus, reliability of the semiconductor laser element in high output power operations can be increased.

(b) Since the optical waveguide layers are made of GaAs, it is possible to lower the temperature during growth of the GaAs lower (first) optical waveguide layer, and grow the active layer at low temperature. Therefore, the quality of the active layer can be improved.

(c) When the contact layer of the second conductive type is formed above the upper cladding portion so as to leave at least one second space in at least one second vicinity of the at least one of the opposite end facets, current injection into the window structure can be suppressed. Therefore, it is possible to further increase optical output power.

(d) When an index-guided structure is realized by forming a ridge structure in the upper cladding portion or an internal current confinement structure, it is possible to accurately control the oscillation mode of laser light.

(e) When the upper cladding portion in the semiconductor laser element according to the present invention has a multilayer structure, the etching depth can be easily controlled by internally arranging etching stop layers made of InGaP-based and GaAs-based materials and utilizing the fact that the InGaP-based and GaAs-based materials are selectively etched. Thus, the index-guided structure can be easily and accurately produced.

DESCRIPTION OF PREFERRED EMBODIMENTS

Embodiments of the present invention are explained in detail below with reference to FIGS. 1A to 8C.

First Embodiment

Figure 1A:
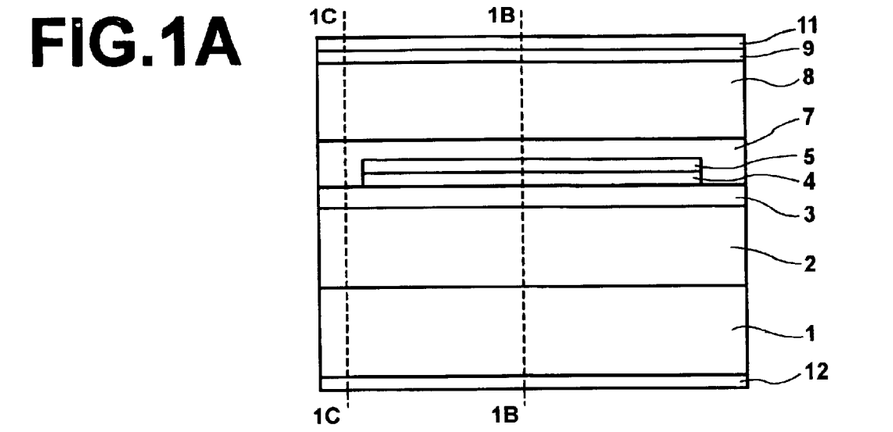
FIGS. 1A, 1B, and 1C are cross-sectional views of a semiconductor laser element as a first embodiment of the present invention.
Figure 1B:
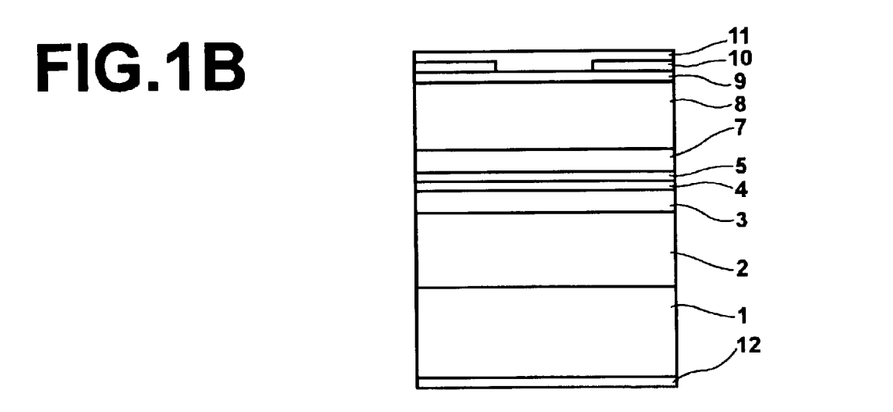
Figure 1C:
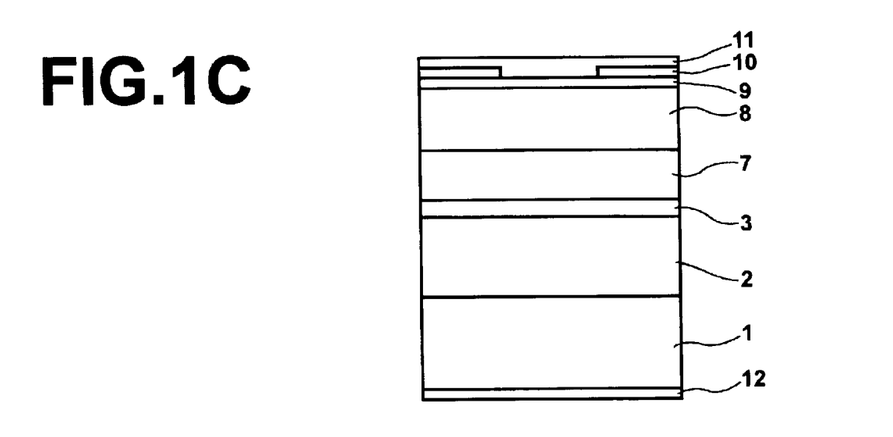

FIGS. 1A, 1B, and 1C are cross-sectional views of a semiconductor laser element as the first embodiment of the present invention. FIG. 1A shows a cross section parallel to the laser oscillation direction and perpendicular to the thickness direction, and FIGS. 1B and 1C respectively show the 1B—1B and 1C—1C cross sections indicated in FIG. 1A. That is, FIG. 1B shows a cross section which is located in a center portion of the semiconductor laser element and perpendicular to the laser oscillation direction, and FIG. 1C shows a cross section which is located in a vicinity of an end facet and perpendicular to the laser oscillation direction. Although, in practice, a plurality of semiconductor laser elements are concurrently manufactured on a semiconductor wafer as a substrate, and arranged side by side, a construction corresponding to only one semiconductor laser element is indicated in each of FIGS. 1A to 1C for the sake of simplicity of illustration and better understanding.

In the semiconductor laser element as the first embodiment, an n-type $Ga_{1-z1}Al_{z1}As$ lower cladding layer 2 ($0.25 \leq z1 \leq 0.8$), an n-type or i-type (intrinsic) GaAs lower optical waveguide layer 3, an $In_{x3}Ga_{1-x3}As_{1-y3}P_{y3}$ compressive-strain quantum-well active layer 4 ($0.49y3<x3 \leq 0.4$, $0 \leq y3 \leq 0.1$), an i-type GaAs layer 5 (having a thickness of about 20 nm), a p-type or i-type GaAs upper optical waveguide layer 7, a p-type $Ga_{1-z1}Al_{z1}As$ upper cladding layer 8, and a p-type GaAs contact layer 9 are formed in this order on a (100) face of an n-type GaAs substrate 1. In addition, the semiconductor laser element comprises an insulation film 10 having a current injection opening and being formed on the p-type GaAs contact layer 9, a p electrode 11 covering the current injection opening, and an n electrode 12 formed on the surface of the n-type GaAs substrate 1 opposite to the surface on which the above semiconductor layers 2 to 9 are formed.

Further, the $In_{x3}Ga_{1-x3}As_{1-y3}P_{y3}$ quantum-well active layer 4 and the i-type GaAs layer 5 are not arranged in near-edge regions being located in vicinities of resonator faces and having predetermined widths, and the spaces produced by the absence of the $In_{x3}Ga_{1-x3}As_{1-y3}P_{y3}$ quantum-well active layer 4 and the i-type GaAs layer 5 in the near-edge regions are filled with the p-type or i-type GaAs upper optical waveguide layer 7. That is, the spaces are filled with the optical waveguide layer which has a bandgap greater than the bandgap of the $In_{x3}Ga_{1-x3}As_{1-y3}P_{y3}$ quantum-well active layer 4, so that a so-called window structure is realized. Thus, it is possible to suppress absorption of laser light in the vicinities of the end facets and occurrence of the COMD.

A process for producing the semiconductor laser element as the first embodiment is explained below.

First, the n-type $Ga_{1-z1}Al_{z1}As$ lower cladding layer 2 ($0.25 \leq z1 \leq 0.8$), the n-type or i-type GaAs lower optical waveguide layer 3, the $In_{x3}Ga_{1-x3}As_{1-y3}P_{y3}$ compressive-strain quantum-well active layer 4 ($0.49y3<x3 \leq 0.4$, $0 \leq y3 \leq 0.1$), the i-type GaAs layer 5 (having a thickness of about 20 nm), and an $In_{0.49}Ga_{0.51}P$ cap layer (having a thickness of about 20 nm and not being shown) are formed in this order on the (100) face of the n-type GaAs substrate 1 by organometallic vapor phase epitaxy.

Next, a resist is applied to the $In_{0.49}Ga_{0.51}P$ cap layer, and a plurality of stripe areas of the resist extending in the <0$\bar{1}$1> direction and being arranged at regular intervals corresponding to a predetermined resonator length are removed by conventional lithography, where each of the plurality of stripe areas of the resist has a width of about 40 micrometers. Then, a plurality of stripe regions of the $In_{0.49}Ga_{0.51}P$ cap layer which are not covered by the remaining areas of the resist are etched off by using a hydrochloric-acid-based etching solution as an etchant and the remaining areas of the resist as a mask so as to expose a plurality of stripe regions of the i-type GaAs layer 5 under the plurality of stripe regions of the $In_{0.49}Ga_{0.51}P$ cap layer. At this time, the etching automatically stops at the upper boundary of the i-type GaAs layer 5. After the remaining areas of the resist are removed, the plurality of stripe regions of the i-type GaAs layer 5 and a plurality of stripe regions of the $In_{x3}Ga_{1-x3}As_{1-y3}P_{y3}$ quantum-well active layer 4 under the plurality of stripe regions of the i-type GaAs layer 5 are etched off with a sulfuric-acid-based slow etching solution ($H_2SO_4:H_2O_2:H_2O=4:1:90$) until a plurality of stripe regions of the n-type or i-type GaAs lower optical waveguide layer 3 under the plurality of stripe regions of the $In_{x3}Ga_{1-x3}As_{1-y3}P_{y3}$ quantum-well active layer 4 are exposed. At this time, a portion of the n-type or i-type GaAs lower optical waveguide layer 3 may be etched. Thus, the near-edge regions of the i-type GaAs layer 5 and the $In_{x3}Ga_{1-x3}As_{1-y3}P_{y3}$ quantum-well active layer 4 (i.e., the plurality of stripe regions of the i-type GaAs layer 5 and the plurality of stripe regions of the $In_{x3}Ga_{1-x3}As_{1-y3}P_{y3}$ quantum-well active layer 4 including positions at which resonator faces are to be formed and each having a width of 40 micrometers) are removed.

Subsequently, the $In_{0.49}Ga_{0.51}P$ cap layer is removed with a hydrochloric-acid-based etching solution, and thereafter the p-type or i-type GaAs upper optical waveguide layer 7, the p-type $Ga_{1-z1}Al_{z1}As$ upper cladding layer 8, and the p-type GaAs contact layer 9 are formed. In addition, the insulation film 10 is formed on the p-type GaAs contact layer 9, and then a plurality of current injection openings each of which has a stripe form and extends in the <011> direction are produced in the insulation film 10 by conventional lithography. Further, the p electrode 11 is formed by evaporation so as to cover the plurality of current injection openings, the opposite surface of the n-type GaAs substrate 1 is polished, and the n electrode 12 is formed on the polished surface of the n-type GaAs substrate 1 Thereafter, the above layered structure is cleaved into bars each having resonator faces on opposite sides, and a high-reflection coating and a low-reflection coating are respectively applied to the opposite resonator faces of each bar. Finally, the construction illustrated in FIGS. 1A, 1B, and 1C is formed into a chip. Thus, the semiconductor laser element as the first embodiment is obtained.

Second Embodiment

Figure 2A:
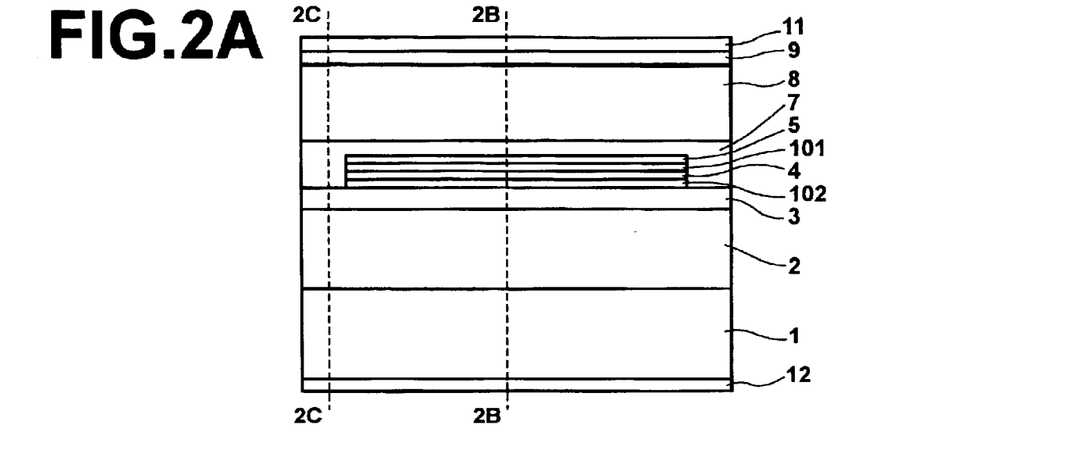
FIGS. 2A, 2B, and 2C are cross-sectional views of a semiconductor laser element as a second embodiment of the present invention.
Figure 2B:
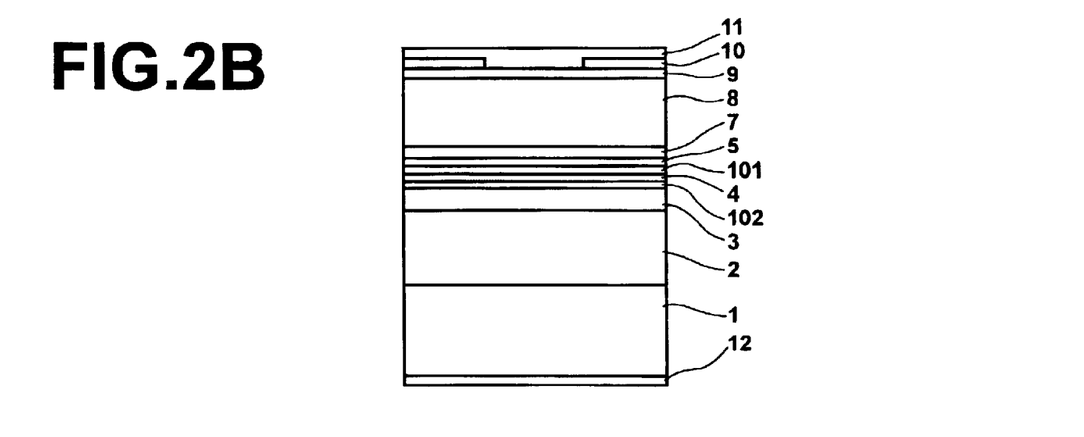
Figure 2C:
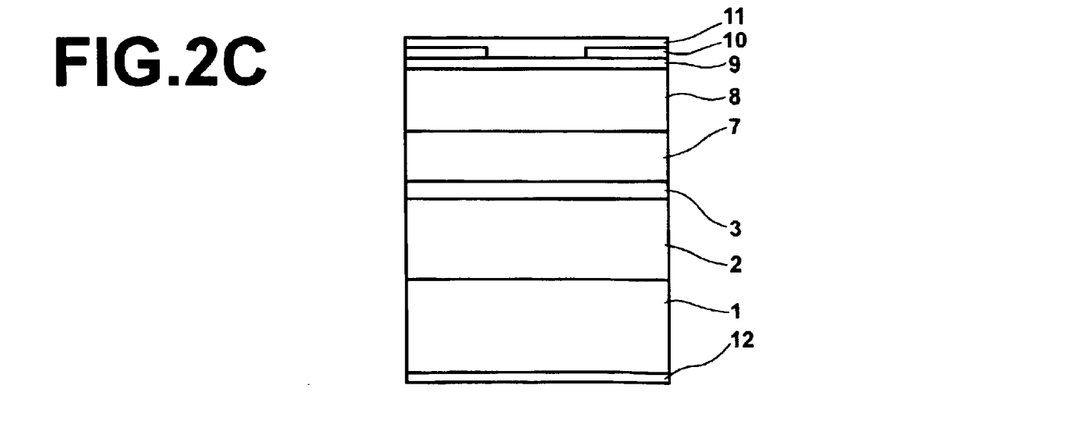

FIGS. 2A, 2B, and 2C are cross-sectional views of a semiconductor laser element as the second embodiment of the present invention. FIG. 2A shows a cross section parallel to the laser oscillation direction and perpendicular to the thickness direction, and FIGS. 2B and 2C respectively show the 2B—2B and 2C—2C cross sections indicated in FIG. 2A. That is, FIG. 2B shows a cross section which is located in a center portion of the semiconductor laser element and perpendicular to the laser oscillation direction, and FIG. 2C shows a cross section which is located in a vicinity of an end facet and perpendicular to the laser oscillation direction. For the same reason as the first embodiment, a construction corresponding to only one semiconductor laser element is indicated in each of FIGS. 2A to 2C.

The semiconductor laser element as the second embodiment of the present invention is identical to the semiconductor laser element as first embodiment except that the first embodiment in that $In_{x1}Ga_{1-x3}As_{1-y1}P_{y1}$ tensile-strain barrier layers 101 and 102 ($0 \leq x1 < 0.49y1$, $0 < y1 \leq 0.6$) are formed above and under the $In_{x3}Ga_{1-x3}As_{1-y3}P_{y3}$ quantum-well active layer 4 in order to compensate for the strain in the $In_{x3}Ga_{1-x3}As_{1-y3}P_{y3}$ quantum-well active layer 4.

In this case, portions of the $In_{x1}Ga_{1-x1}As_{1-y1}P_{y1}$ tensile-strain barrier layers 101 and 102 in vicinities of end facets (i.e., near-edge portions of the $In_{x1}Ga_{1-x1}As_{1-y1}P_{y1}$ tensile-strain barrier layers 101 and 102) are also removed, and spaces produced by the removal of the near-edge portions of the $In_{x1}Ga_{1-x1}As_{1-y1}P_{y1}$ tensile-strain barrier layers 101 and 102 are also filled with the p-type or i-type GaAs upper optical waveguide layer 7, as illustrated in FIGS. 2A to 2C.

Third Embodiment

Figure 3A:
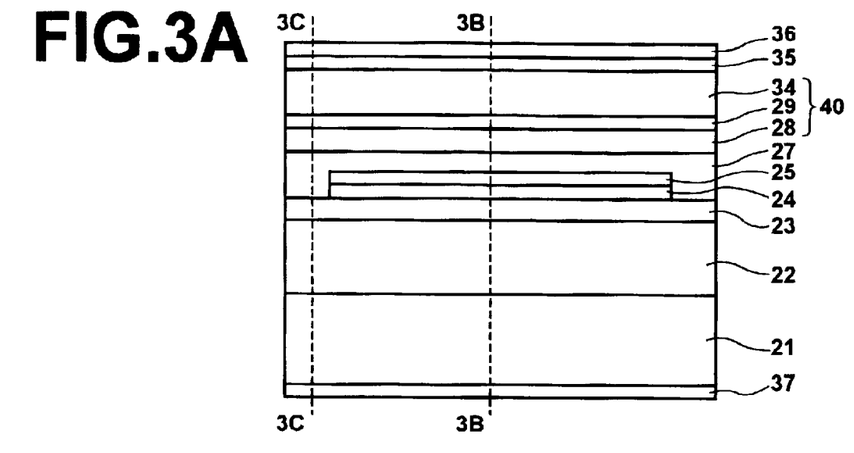
FIGS. 3A, 3B, and 3C are cross-sectional views of a semiconductor laser element as a third embodiment of the present invention.
Figure 3B:
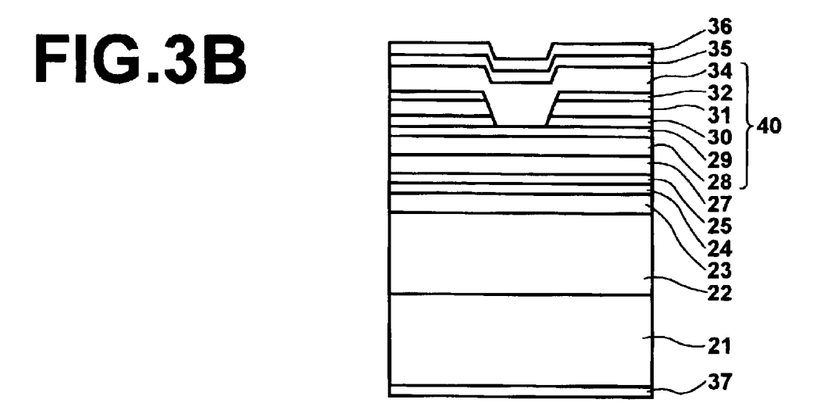
Figure 3C:
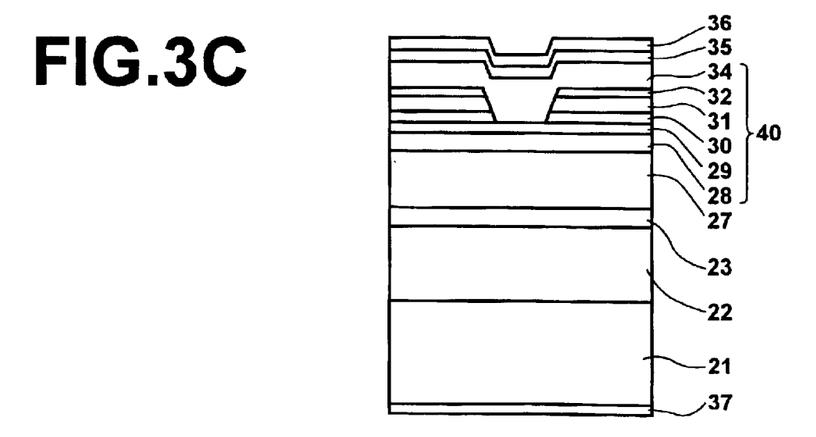

FIGS. 3A, 3B, and 3C are cross-sectional views of a semiconductor laser element as the third embodiment of the present invention. FIG. 3A shows a cross section parallel to the laser oscillation direction and perpendicular to the thickness direction, and FIGS. 3B and 3C respectively show the 3B—3B and 3C—3C cross sections indicated in FIG. 3A. That is, FIG. 3B shows a cross section which is located in a center portion of the semiconductor laser element and perpendicular to the laser oscillation direction, and FIG. 3C shows a cross section which is located in a vicinity of an end facet and perpendicular to the laser oscillation direction. For the same reason as the first embodiment, a construction corresponding to only one semiconductor laser element is indicated in each of FIGS. 3A to 3C for the sake of simplicity of illustration and better understanding.

In the semiconductor laser element as the third embodiment, an n-type $Ga_{1-z1}Al_{z1}Al_{z1}As$ lower cladding layer 22 ($0.25 \leq z1 \leq 0.8$), an n-type or i-type GaAs lower optical waveguide layer 23, an $In_{x3}Ga_{1-x3}As_{1-y3}P_{y3}$ compressive-strain quantum-well active layer 24 ($0.49y3 < x3 \leq 0.4$, $0 \leq y3 \leq 0.1$), an i-type GaAs layer 25, a p-type or i-type GaAs upper optical waveguide layer 27, a p-type $Ga_{1-z1}Al_{z1}As$ first upper cladding layer 28, a p-type GaAs first etching stop layer 29, an $In_{x8}Ga_{1-x8}P$ second etching stop layer 30 ($0 \leq x8 \leq 1$) having an opening through which current can pass, an n-type $Ga_{1-z2}Al_{z2}As$ current confinement layer 31 ($z2 > z1$) having an opening through which current can pass, a GaAs first cap layer 32 having an opening through which current can pass, a p-type $Ga_{1-z1}Al_{z1}As$ second upper cladding layer 34, and a p-type GaAs contact layer 35 are formed in this order on an n-type GaAs substrate 21. In addition, the semiconductor laser element as the third embodiment comprises a p electrode 36 formed on the p-type GaAs contact layer 35, and an n electrode 37 formed on the surface of the n-type GaAs substrate 21 opposite to the surface on which the above semiconductor layers 22 to 35 are formed. The layers from the p-type $Ga_{1-z1}Al_{z1}As$ first upper cladding layer 28 up to the p-type $Ga_{1-z1}Al_{z1}As$ second upper cladding layer 34 constitute a p-type cladding portion 40 (corresponding to the aforementioned upper cladding portion).

Further, the $In_{x3}Ga_{1-x3}As_{1-y3}P_{y3}$ compressive-strain quantum-well active layer 24 and the i-type GaAs layer 25 are not arranged in near-edge regions being located in vicinities of resonator faces and having predetermined widths, and the spaces produced by the absence of the $In_{x3}Ga_{1-x3}As_{1-y3}P_{y3}$ compressive-strain quantum-well active layer 24 and the i-type GaAs layer 25 in the near-edge regions are filled with the p-type or i-type GaAs upper optical waveguide layer 27. That is, the spaces are filled with the optical waveguide layer which has a bandgap greater than the bandgap of the $In_{x3}Ga_{1-x3}As_{1-y3}P_{y3}$ compressive-strain quantum-well active layer 24, so that a so-called window structure is realized. Thus, it is possible to suppress absorption of laser light in the vicinities of the end facets and occurrence of the COMD.

A process for producing the semiconductor laser element as the third embodiment is explained below.

First, the n-type $Ga_{1-z1}Al_{z1}As$ lower cladding layer 22 ($0.25 \leq z1 \leq 0.8$), the n-type or i-type GaAs lower optical waveguide layer 23, the $In_{x3}Ga_{1-x3}As_{1-y3}P_{y3}$ compressive-strain quantum-well active layer 24 ($0.49y3 < x3 \leq 0.4$, $0 \leq y3 \leq 0.1$), the i-type GaAs layer 25 (having a thickness of about 20 nm), and an $In_{0.49}Ga_{0.51}P$ second cap layer (having a thickness of about 20 nm and not being shown) are formed in this order on a (100) face of the n-type GaAs substrate 21 by organometallic vapor phase epitaxy.

Next, a resist is applied to the $In_{0.49}Ga_{0.51}P$ second cap layer, and a plurality of stripe areas of the resist extending in the $<0\bar{1}1>$ direction and being arranged at regular intervals corresponding to a predetermined resonator length are removed by conventional lithography, where each of the plurality of stripe areas of the resist has a width of about 40 micrometers. Then, a plurality of stripe regions of the $In_{0.49}Ga_{0.51}P$ second cap layer which are not covered by the remaining areas of the resist are etched off by using a hydrochloric-acid-based etching solution as an etchant and the remaining areas of the resist as a mask so as to expose a plurality of stripe regions of the i-type GaAs layer 25 under the plurality of stripe regions of the $In_{0.49}Ga_{0.51}P$ second cap layer. At this time, the etching automatically stops at the upper boundary of the i-type GaAs layer 25. After the remaining areas of the resist are removed, the plurality of stripe regions of the i-type GaAs layer 25 and a plurality of stripe regions of the $In_{x3}Ga_{1-x3}As_{1-y3}P_{y3}$ quantum-well active layer 24 under the plurality of stripe regions of the i-type GaAs layer 25 are etched off with a sulfuric-acid-based slow etching solution ($H_2SO_4:H_2O_2:H_2O=4:1:90$) until a plurality of stripe regions of the n-type or i-type GaAs lower optical waveguide layer 23 under the plurality of stripe regions of the $In_{x3}Ga_{1-x3}As_{1-y3}P_{y3}$ quantum-well active layer 24 are exposed. At this time, a portion of the n-type or i-type GaAs lower optical waveguide layer 23 may be etched. Thus, the near-edge regions of the i-type GaAs layer 25 and the $In_{x3}Ga_{1-x3}As_{1-y3}P_{y3}$ quantum-well active layer 24 (i.e., the plurality of stripe regions of the i-type GaAs layer 25 and the plurality of stripe regions of the $In_{x3}Ga_{1-x3}As_{1-y3}P_{y3}$ quantum-well active layer 24 including positions at which resonator faces are to be formed and each having a width of 40 micrometers) are removed.

Subsequently, the $In_{0.49}Ga_{0.51}P$ second cap layer is removed with a hydrochloric-acid-based etching solution, and thereafter the p-type or i-type GaAs upper optical waveguide layer 27 is formed so as to fill the spaces produced by the removal of the near-edge regions of the i-type GaAs layer 25 and the $In_{x3}Ga_{1-x3}As_{1-y3}P_{y3}$ quantum-well active layer 24. Then, the p-type $Ga_{1-z1}Al_{z1}As$ first upper cladding layer 28, the p-type GaAs first etching stop layer 29, the $In_{x8}Ga_{1-x8}P$ second etching stop layer 30 ($0 \leq x8 \leq 1$), the n-type $Ga_{1-z2}Al_{z2}As$ current confinement layer 31 (z2>z1), the GaAs first cap layer 32, and an $In_{0.49}Ga_{0.51}P$ third cap layer (not shown) are formed on the p-type or i-type GaAs upper optical waveguide layer 27.

Thereafter, a resist is applied to the $In_{0.49}Ga_{0.51}P$ third cap layer, and a plurality of stripe areas of the resist corresponding to current injection openings of semiconductor laser elements are removed, where each of the plurality of stripe areas of the resist extends in the <011> direction (which is perpendicular to the <0$\bar{1}$1> direction), and has a width of about 1 to 3 micrometers. Then, a plurality of stripe regions of the $In_{0.49}Ga_{0.51}P$ third cap layer under the plurality of stripe areas of the resist are etched off by using a hydrochloric-acid-based etching solution as an etchant and the remaining areas of the resist as a mask. At this time, the etching automatically stops at the upper boundary of the GaAs first cap layer 32. After the remaining areas of the resist are removed, a plurality of stripe regions of the GaAs first cap layer 32 under the plurality of stripe regions of the $In_{0.49}Ga_{0.51}P$ third cap layer and a plurality of stripe regions of the n-type $Ga_{1-z2}Al_{z2}As$ current confinement layer 31 under the plurality of stripe regions of the GaAs first cap layer 32 are etched off by using a sulfuric-acid-based etching solution as an etchant and the remaining regions of the $In_{0.49}Ga_{0.51}P$ third cap layer as a mask. Further, the remaining regions of the $In_{0.49}Ga_{0.51}P$ third cap layer and a plurality of stripe regions of the $In_{x8}Ga_{1-x8}P$ second etching stop layer 30 under the plurality of stripe regions of the n-type $Ga_{1-z2}Al_{z2}As$ current confinement layer 31 are removed with a hydrochloric-acid-based etching solution. Thus, the current injection opening for each semiconductor laser element is produced.

Subsequently, the p-type $Ga_{1-z1}Al_{z1}As$ second upper cladding layer 34, the p-type GaAs contact layer 35, and the p electrode 36 are formed in this order on the layered structure formed as above. Then, the opposite surface of the n-type GaAs substrate 21 is polished, and the n electrode 37 is formed on the polished surface of the n-type GaAs substrate 21. Thereafter, the above layered structure is cleaved into bars each having resonator faces on opposite sides, and a high-reflection coating and a low-reflection coating are respectively applied to the opposite resonator faces of each bar. Finally, the construction illustrated in FIGS. 3A, 3B, and 3C is formed into a chip. Thus, the semiconductor laser element as the third embodiment is obtained.

In the above construction of the semiconductor laser element, the thickness of the p-type or i-type GaAs upper optical waveguide layer 27, the thickness and composition of the p-type $Ga_{1-z1}Al_{z1}As$ first upper cladding layer 28, and the composition of the p-type $Ga_{1-z1}Al_{z1}As$ second upper cladding layer 34 are determined so that oscillation in a fundamental transverse mode can be realized even in a high output power operation, i.e., the difference in the equivalent refractive index between the portion of the active region under the current injection window and the other portions of the active region is set in the range of about $1.5 \times 10^{-3}$ to $7 \times 10^{-3}$.

Further, the p-type first upper cladding layer may be made of $In_{0.49}Ga_{0.51}P$.

Fourth Embodiment

Figure 4A:
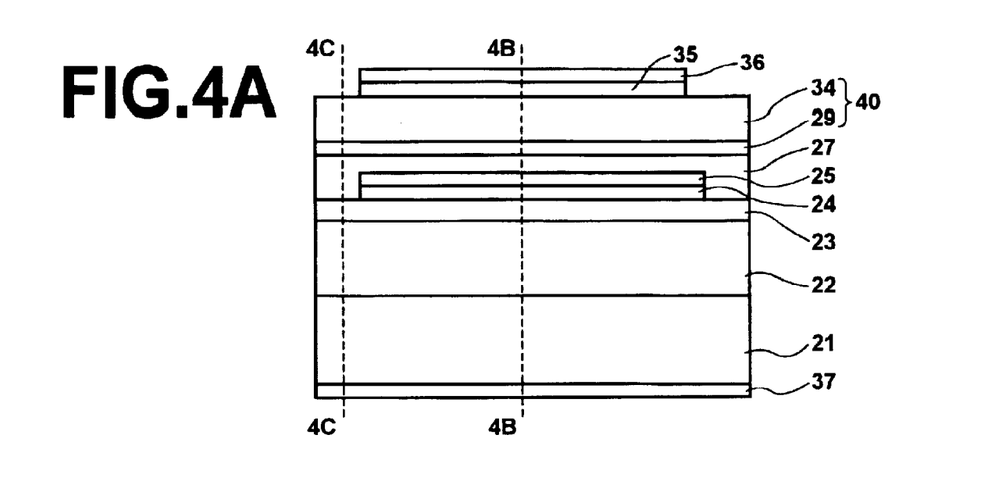
FIGS. 4A, 4B, and 4C are cross-sectional views of a semiconductor laser element as a fourth embodiment of the present invention.
Figure 4B:
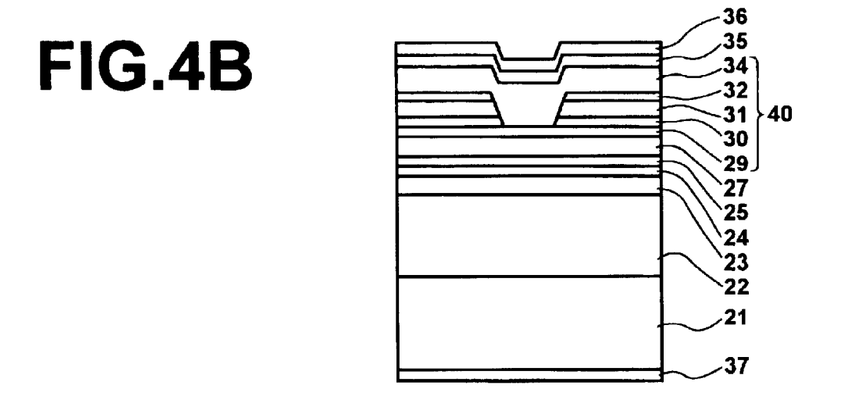
Figure 4C:
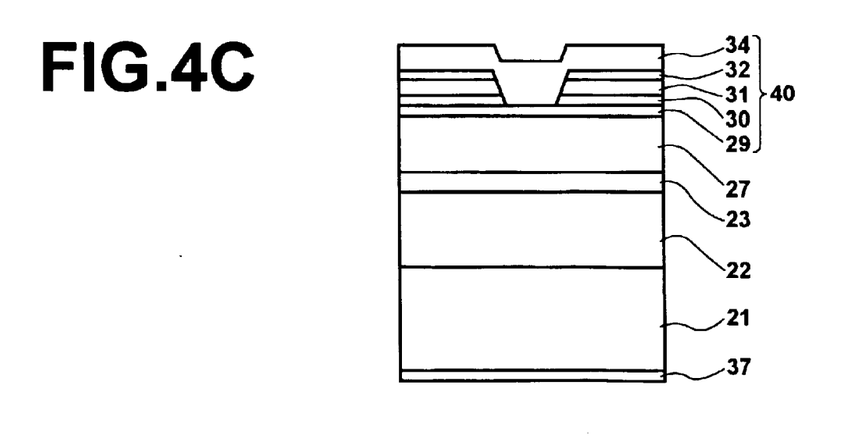

FIGS. 4A, 4B, and 4C are cross-sectional views of a semiconductor laser element as the fourth embodiment of the present invention. FIG. 4A shows a cross section parallel to the laser oscillation direction and perpendicular to the thickness direction, and FIGS. 4B and 4C respectively show the 4B—4B and 4C—4C cross sections indicated in FIG. 4A. That is, FIG. 4B shows a cross section which is located in a center portion of the semiconductor laser element and perpendicular to the laser oscillation direction, and FIG. 4C shows a cross section which is located in a vicinity of an end facet and perpendicular to the laser oscillation direction. For the same reason as the first embodiment, a construction corresponding to only one semiconductor laser element is indicated in each of FIGS. 4A to 4C.

The semiconductor laser element as the fourth embodiment of the present invention is identical to the semiconductor laser element as third embodiment except that the p-type $Ga_{1-z1}Al_{z1}As$ first upper cladding layer 28 is not formed, and the p-type GaAs contact layer 35 and the p electrode 36 are formed in only an area corresponding to the area of the $In_{x3}Ga_{1-x3}As_{1-y3}P_{y3}$ compressive-strain quantum-well active layer 24, i.e., the p-type GaAs contact layer 35 and the p electrode 36 are not formed in the vicinities of the end facets.

Even when the p-type $Ga_{1-z1}Al_{z1}As$ first upper cladding layer 28 is not formed, the difference in the equivalent refractive index between the portion of the active region under the current injection window and the other portions of the active region can be set to $1.5 \times 10^{-3}$ to $7 \times 10^{-3}$ by appropriately controlling the thickness of the p-type or i-type GaAs upper optical waveguide layer 27 and the thickness and composition of the p-type $Ga_{1-z1}Al_{z1}As$ second upper cladding layer 34.

Since the p-type GaAs contact layer 35 and the p electrode 36 are not formed in the vicinities of the end facets, current injection into the near-edge regions (i.e., window regions) can be significantly suppressed. Therefore, the so-called window effect can be further enhanced, and the reliability of the semiconductor laser element is increased.

Further, it is not necessary that the size of the p electrode 36 is identical to that of the p-type GaAs contact layer 35. For example, the p electrode 36 may also be formed on the exposed area of the p-type $Ga_{1-z1}Al_{z1}As$ second upper cladding layer 34 in the vicinities of the end facets.

Fifth Embodiment

Figure 5A:
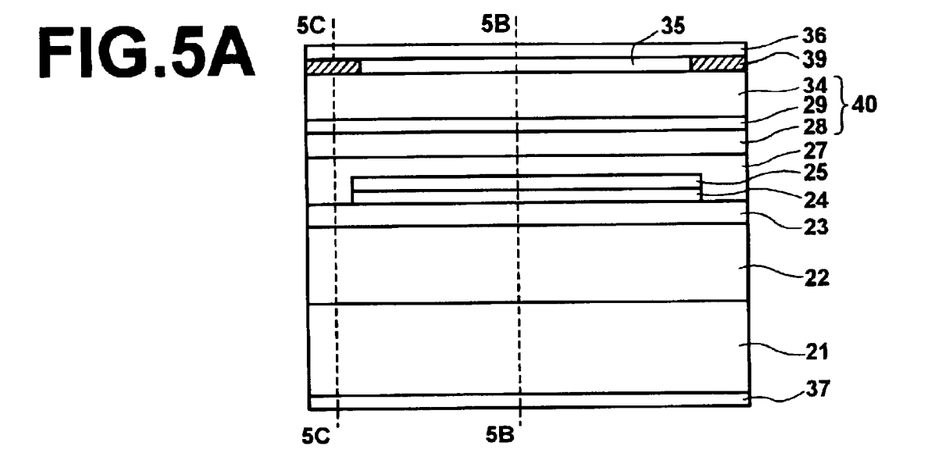
FIGS. 5A, 5B, and 5C are cross-sectional views of a semiconductor laser element as a fifth embodiment of the present invention.
Figure 5B:
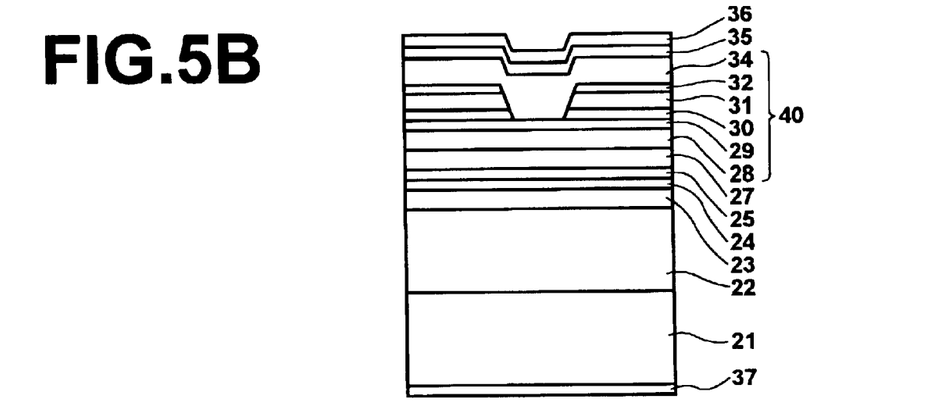
Figure 5C:
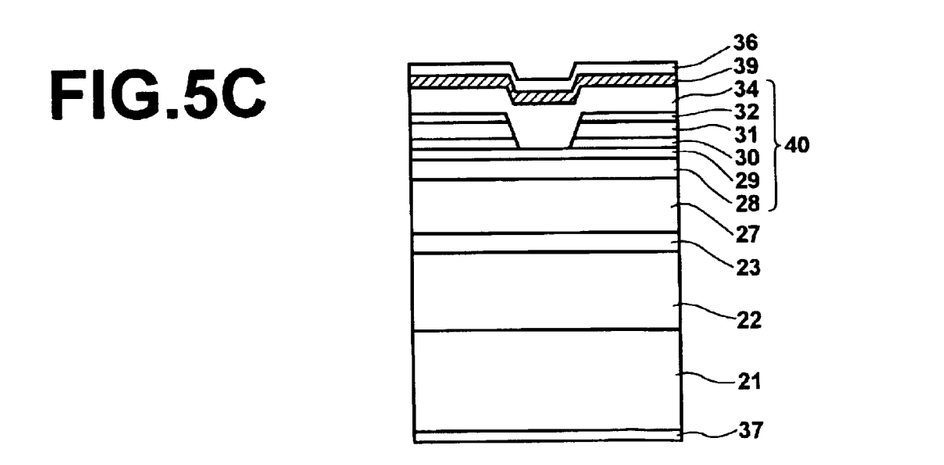

FIGS. 5A, 5B, and 5C are cross-sectional views of a semiconductor laser element as the fifth embodiment of the present invention. FIG. 5A shows a cross section parallel to the laser oscillation direction and perpendicular to the thickness direction, and FIGS. 5B and 5C respectively show the 5B—5B and 5C—5C cross sections indicated in FIG. 5A. That is, FIG. 5B shows a cross section which is located in a center portion of the semiconductor laser element and perpendicular to the laser oscillation direction, and FIG. 5C shows a cross section which is located in a vicinity of an end facet and perpendicular to the laser oscillation direction. For the same reason as the first embodiment, a construction corresponding to only one semiconductor laser element is indicated in each of FIGS. 5A to 5C.

The semiconductor laser element as the fifth embodiment of the present invention is identical to the semiconductor laser element as third embodiment except that the p-type GaAs contact layer 35 is formed in only the area corresponding to the area of the $In_{x3}Ga_{1-x3}As_{1-y3}P_{y3}$ compressive-strain quantum-well active layer 24 (i.e., the portions of the p-type GaAs contact layer 35 in the vicinities of the end facets are removed), and the exposed portions of the p-type $Ga_{1-z1}Al_{z1}As$ second upper cladding layer 34 in the vicinities of the end facets are covered with an insulation film 39.

That is, the semiconductor laser element as the fifth embodiment of the present invention can be produced by modifying the process for producing the semiconductor laser element as the third embodiment in such a manner that the portions of the p-type GaAs contact layer 35 in the vicinities of the end facets are removed after the p-type GaAs contact layer 35 is formed on the entire area of the p-type $Ga_{1-z1}Al_{z1}As$ second upper cladding layer 34, the exposed portions of the p-type $Ga_{1-z1}Al_{z1}As$ second upper cladding layer 34 are covered with the insulation film 39, and the p electrode 36 is formed over the p-type GaAs contact layer 35 and the insulation film 39.

Since the p-type GaAs contact layer 35 is not formed in the vicinities of the end facets, and the exposed portions of the p-type $Ga_{1-z1}Al_{z1}As$ second upper cladding layer 34 in the vicinities of the end facets are covered with the insulation film 39, current injection into the window regions can be significantly suppressed. Therefore, the optical output power can be increased.

Sixth Embodiment

Figure 6A:
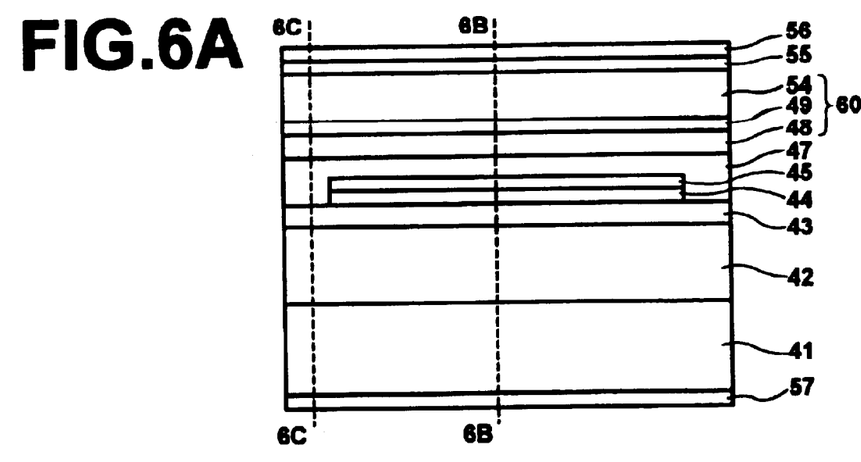
FIGS. 6A, 6B, and 6C are cross-sectional views of a semiconductor laser element as a sixth embodiment of the present invention.
Figure 6B:
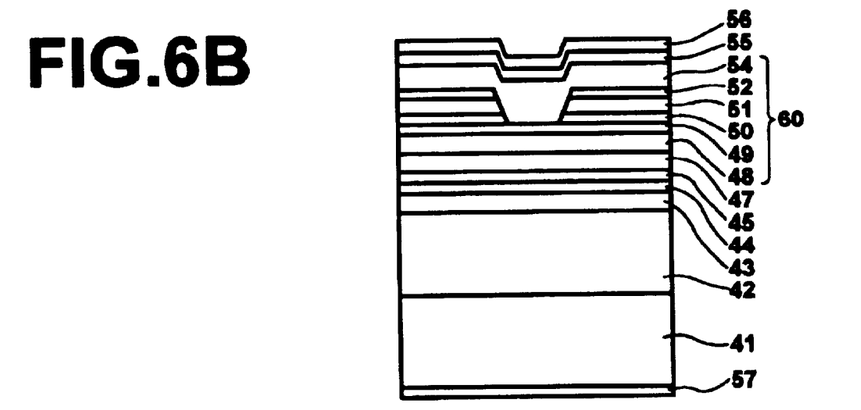
Figure 6C:
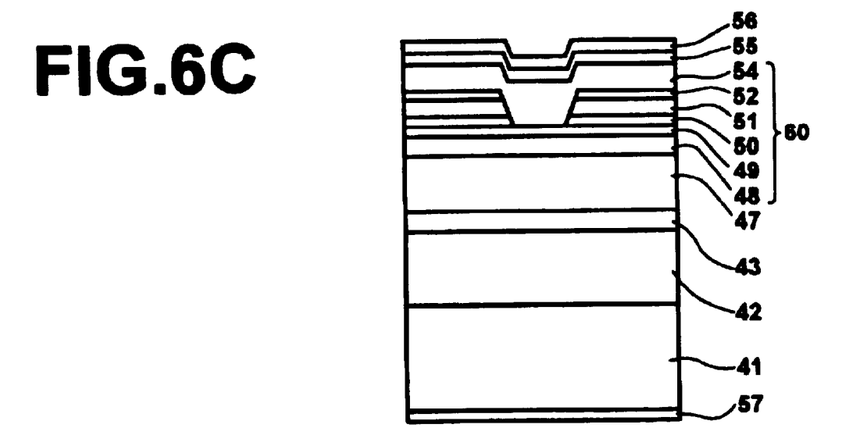

FIGS. 6A, 6B, and 6C are cross-sectional views of a semiconductor laser element as the sixth embodiment of the present invention. FIG. 6A shows a cross section parallel to the laser oscillation direction and perpendicular to the thickness direction, and FIGS. 6B and 6C respectively show the 6B—6B and 6C—6C cross sections indicated in FIG. 6A. That is, FIG. 6B shows a cross section which is located in a center portion of the semiconductor laser element and perpendicular to the laser oscillation direction, and FIG. 6C shows a cross section which is located in a vicinity of an end facet and perpendicular to the laser oscillation direction. For the same reason as the first embodiment, a construction corresponding to only one semiconductor laser element is indicated in each of FIGS. 6A to 6C for the sake of simplicity of illustration and better understanding.

In the semiconductor laser element as the sixth embodiment, an n-type $Ga_{1-z1}Al_{z1}As$ lower cladding layer 42 ($0.25 \leq z1 \leq 0.8$), an n-type or i-type GaAs lower optical waveguide layer 43, an $In_{x3}Ga_{1-x3}As_{1-y3}P_{y3}$ compressive-strain quantum-well active layer 44 ($0.49y3 \leq x3 \leq 0.4$, $0 \leq y3 \leq 0.1$), an i-type GaAs layer 45, a p-type or i-type GaAs upper optical waveguide layer 47, a p-type $Ga_{1-z1}Al_{z1}As$ first upper cladding layer 48, a p-type $In_{x8}Ga_{1-x8}P$ first etching stop layer 49 ($0 \leq x8 \leq 1$), a GaAs second etching stop layer 50 having an opening through which current can pass, an n-type $In_{0.49}(Ga_{1-z4}Al_{z4})_{0.51}P$ current confinement layer 51 ($0 \leq z4 \leq 1$) having an opening through which current can pass, an $In_{0.49}Ga_{0.51}P$ first cap layer 52 having an opening through which current can pass, a p-type $Ga_{1-z1}Al_{z1}As$ second upper cladding layer 54, and a p-type GaAs contact layer 55 are formed in this order on an n-type GaAs substrate 41. In addition, the semiconductor laser element as the sixth embodiment comprises a p electrode 56 formed on the p-type GaAs contact layer 55, and an n electrode 57 formed on the surface of the n-type GaAs substrate 41 opposite to the surface on which the above semiconductor layers 42 to 55 are formed. The layers from the p-type $Ga_{1-z1}Al_{z1}As$ first upper cladding layer 48 up to the p-type $Ga_{1-z1}Al_{z1}As$ second upper cladding layer 54 constitute a p-type cladding portion 60 (corresponding to the aforementioned upper cladding portion).

Further, the $In_{x3}Ga_{1-x3}As_{1-y3}P_{y3}$ compressive-strain quantum-well active layer 44 and the i-type GaAs layer 45 are not arranged in near-edge regions being located in vicinities of resonator faces and having predetermined widths, and the spaces produced by the absence of the $In_{x3}Ga_{1-x3}As_{1-y3}P_{y3}$ compressive-strain quantum-well active layer 44 and the i-type GaAs layer 45 in the near-edge regions are filled with the p-type or i-type GaAs upper optical waveguide layer 47. That is, a so-called window structure is realized in the near-edge regions. Thus, it is possible to suppress absorption of laser light in the vicinities of the end facets and occurrence of the COMD.

A process for producing the semiconductor laser element as the sixth embodiment is explained below.

First, the n-type $Ga_{1-z1}Al_{z1}As$ lower cladding layer 42 ($0.25 \leq z1 \leq 0.8$), the n-type or i-type GaAs lower optical waveguide layer 43, the $In_{x3}Ga_{1-x3}As_{1-y3}P_{y3}$ compressive-strain quantum-well active layer 44 ($0.49y3 < x3 \leq 0.4$, $0 \leq y3 \leq 0.1$), the i-type GaAs layer 45 (having a thickness of about 20 nm), and an $In_{0.49}Ga_{0.51}P$ second cap layer (having a thickness of about 20 nm and not being shown) are formed in this order on a (100) face of the n-type GaAs substrate 41 by organometallic vapor phase epitaxy.

Next, a resist is applied to the $In_{0.49}Ga_{0.51}P$ second cap layer, and a plurality of stripe areas of the resist extending in the $<0\bar{1}1>$ direction and being arranged at regular intervals corresponding to a predetermined resonator length are removed by conventional lithography, where each of the plurality of stripe areas of the resist has a width of about 40 micrometers. Then, a plurality of stripe regions of the $In_{0.49}Ga_{0.51}P$ second cap layer which are not covered by the remaining areas of the resist are etched off by using a hydrochloric-acid-based etching solution as an etchant and the remaining areas of the resist as a mask so as to expose a plurality of stripe regions of the i-type GaAs layer 45 under the plurality of stripe regions of the $In_{0.49}Ga_{0.51}P$ second cap layer. At this time, the etching automatically stops at the upper boundary of the i-type GaAs layer 45. After the remaining areas of the resist are removed, the plurality of stripe regions of the i-type GaAs layer 45 and a plurality of stripe regions of the $In_{x3}Ga_{1-x3}As_{1-y3}P_{y3}$ quantum-well active layer 44 under the plurality of stripe regions of the i-type GaAs layer 45 are etched off with a sulfuric-acid-based slow etching solution ($H_2SO_4:H_2O_2:H_2O=4:1:90$) until a plurality of stripe regions of the n-type or i-type GaAs lower optical waveguide layer 43 under the plurality of stripe regions of the $In_{x3}Ga_{1-x3}As_{1-y3}P_{y3}$ quantum-well active layer 44 are exposed. At this time, a portion of the n-type or i-type GaAs lower optical waveguide layer 43 may be etched. Thus, the near-edge regions of the i-type GaAs layer 45 and the $In_{x3}Ga_{1-x3}As_{1-y3}P_{y3}$ quantum-well active layer 44 (i.e., the plurality of stripe regions of the i-type GaAs layer 45 and the plurality of stripe regions of the $In_{x3}Ga_{1-x3}As_{1-y3}P_{y3}$ quantum-well active layer 44 including positions at which resonator faces are to be formed and each having a width of 40 micrometers) are removed.

Subsequently, the $In_{0.49}Ga_{0.51}P$ second cap layer is removed with a hydrochloric-acid-based etching solution, and thereafter the p-type or i-type GaAs upper optical waveguide layer 47 is formed so as to fill the spaces produced by the removal of the near-edge regions of the i-type GaAs layer 45 and the $In_{x3}Ga_{1-x3}As_{1-y3}P_{y3}$ quantum-well active layer 44. Then, the p-type $Ga_{1-z1}Al_{z1}As$ first upper cladding layer 48, the p-type $In_{x8}Ga_{1-x8}P$ first etching stop layer 49 ($0 \leq x8 \leq 1$), the GaAs second etching stop layer 50, the n-type $In_{0.49}(Ga_{1-z4}Al_{z4})_{0.51}P$ current confinement layer 51 ($0 \leq z4 \leq 1$), the $In_{0.49}Ga_{0.51}P$ first cap layer 52, and a GaAs third cap layer (not shown) are formed on the p-type or i-type GaAs upper optical waveguide layer 47.

Thereafter, a resist is applied to the GaAs third cap layer, and a plurality of stripe areas of the resist corresponding to current injection openings of semiconductor laser elements are removed, where each of the plurality of stripe areas of the resist extends in the <011> direction (which is perpendicular to the <0$\bar{1}$1> direction), and has a width of about 1 to 3 micrometers. Then, a plurality of stripe regions of the GaAs third cap layer under the plurality of stripe areas of the resist are etched off by using a sulfuric-acid-based etching solution as an etchant and the remaining areas of the resist as a mask. At this time, the etching automatically stops at the upper boundary of the $In_{0.49}Ga_{0.51}P$ first cap layer 52. After the remaining areas of the resist are removed, a plurality of stripe regions of the $In_{0.49}Ga_{0.51}P$ first cap layer 52 under the plurality of stripe regions of the GaAs third cap layer and a plurality of stripe regions of the n-type $In_{0.49}(Ga_{1-z4}Al_{z4})_{0.51}P$ current confinement layer 51 under the plurality of stripe regions of the $In_{0.49}Ga_{0.51}P$ first cap layer 52 are etched off by using a hydrochloric-acid-based etching solution as an etchant and the remaining regions of the GaAs third cap layer as a mask. Further, the remaining regions of the GaAs third cap layer and a plurality of stripe regions of the GaAs second etching stop layer 50 under the plurality of stripe regions of the n-type $In_{0.49}(Ga_{1-z4}Al_{z4})_{0.51}P$ current confinement layer 51 are removed with a sulfuric-acid-based etching solution. Thus, the current injection opening for each semiconductor laser element is produced.

Subsequently, the p-type $Ga_{1-z1}Al_{z1}As$ second upper cladding layer 54, the p-type GaAs contact layer 55, and the p electrode 56 are formed in this order on the layered structure formed as above. Then, the opposite surface of the n-type GaAs substrate 41 is polished, and the n electrode 57 is formed on the polished surface of the n-type GaAs substrate 41. Thereafter, the above layered structure is cleaved into bars each having resonator faces on opposite sides, and a high-reflection coating and a low-reflection coating are respectively applied to the opposite resonator faces of each bar. Finally, the construction illustrated in FIGS. 6A, 6B, and 6C is formed into a chip. Thus, the semiconductor laser element as the sixth embodiment is obtained.

In the above construction of the semiconductor laser element, the thickness of the p-type or i-type GaAs upper optical waveguide layer 47, the thickness and composition of the p-type $Ga_{1-z1}Al_{z1}As$ first upper cladding layer 48, and the composition of the p-type $Ga_{1-z1}Al_{z1}As$ second upper cladding layer 54 are determined so that oscillation in a fundamental transverse mode can be realized even in a high output power operation, i.e., the difference in the equivalent refractive index between the portion of the active region under the current injection window and the other portions of the active region is set in the range of about $1.5 \times 10^{-3}$ to $7 \times 10^{-3}$.

In the construction of the semiconductor laser element as the sixth embodiment, the p-type $Ga_{1-z1}Al_{z1}As$ first upper cladding layer 48 may not be formed, as in the fourth embodiment. In this case, the difference in the equivalent refractive index between the portion of the active region under the current injection window and the other portions of the active region can be set to $1.5 \times 10^{-3}$ to $7 \times 10^{-3}$ by appropriately controlling the thickness of the p-type or i-type GaAs upper optical waveguide layer 47 and the thickness and composition of the p-type $Ga_{1-z1}Al_{z1}As$ second upper cladding layer 54.

Seventh Embodiment

Figure 7A:
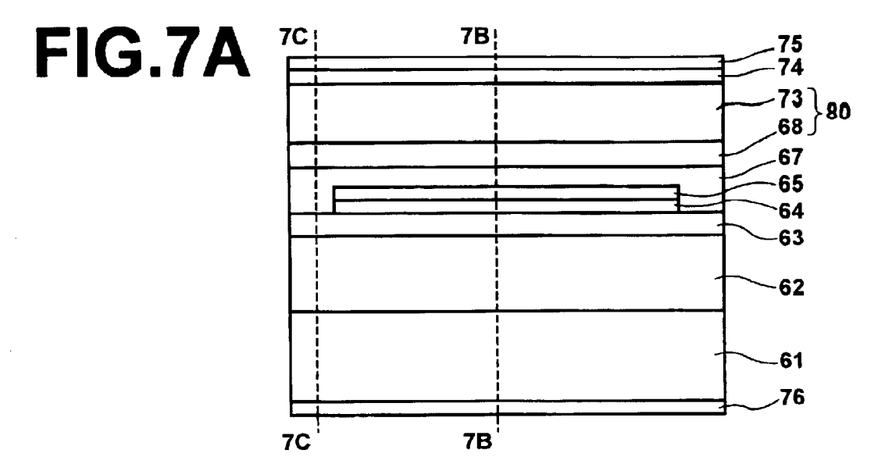
FIGS. 7A, 7B, and 7C are cross-sectional views of a semiconductor laser element as a seventh embodiment of the present invention.
Figure 7B:
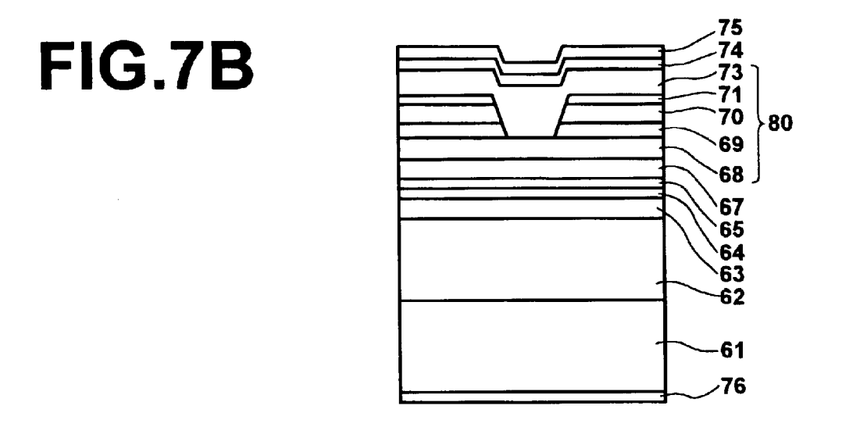
Figure 7C:
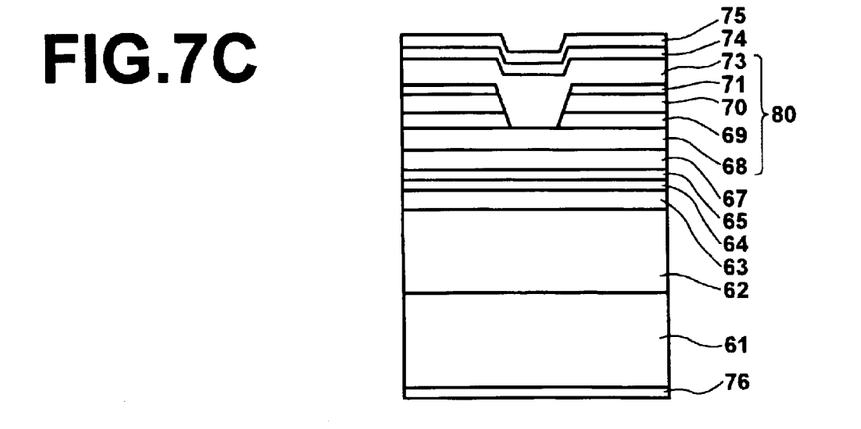

FIGS. 7A, 7B, and 7C are cross-sectional views of a semiconductor laser element as the seventh embodiment of the present invention. FIG. 7A shows a cross section parallel to the laser oscillation direction and perpendicular to the thickness direction, and FIGS. 7B and 7C respectively show the 7B—7B and 7C—7C cross sections indicated in FIG. 7A. That is, FIG. 7B shows a cross section which is located in a center portion of the semiconductor laser element and perpendicular to the laser oscillation direction, and FIG. 7C shows a cross section which is located in a vicinity of an end facet and perpendicular to the laser oscillation direction. For the same reason as the first embodiment, a construction corresponding to only one semiconductor laser element is indicated in each of FIGS. 7A to 7C for the sake of simplicity of illustration and better understanding.

In the semiconductor laser element as the seventh embodiment, an n-type $Ga_{1-z1}Al_{z1}As$ lower cladding layer 62 ($0.25 > z1 \leq 0.8$), an n-type or i-type GaAs lower optical waveguide layer 63, an $In_{x3}Ga_{1-x3}As_{1-y3}P_{y3}$ compressive-strain quantum-well active layer 64 ($0.49y3 < x3 \leq 0.4$, $0 \leq y3 \leq 0.1$), an i-type GaAs layer 65, a p-type or i-type GaAs upper optical waveguide layer 67, a p-type $In_{0.49}Ga_{0.51}P$ first upper cladding layer 68, a GaAs etching stop layer 69 having an opening through which current can pass, an n-type $In_{0.49}(Ga_{1-z4}Al_{z4})_{0.51}P$ current confinement layer 70 ($0 \leq z4 \leq 1$) having an opening through which current can pass, an $In_{0.49}Ga_{0.51}P$ first cap layer 71 having an opening through which current can pass, a p-type $Ga_{1-z1}Al_{z1}As$ second upper cladding layer 73, and a p-type GaAs contact layer 74 are formed in this order on an n-type GaAs substrate 61. In addition, the semiconductor laser element as the seventh embodiment comprises a p electrode 75 formed on the p-type GaAs contact layer 74, and an n electrode 76 formed on the surface of the n-type GaAs substrate 61 opposite to the surface on which the above semiconductor layers 62 to 74 are formed. The layers from the p-type $In_{0.49}Ga_{0.51}P$ first upper cladding layer 68 up to the p-type $Ga_{1-z1}Al_{z1}As$ second upper cladding layer 73 constitute a p-type cladding portion 80 (corresponding to the aforementioned upper cladding portion).

Further, the $In_{x3}Ga_{1-x3}As_{1-y3}P_{y3}$ compressive-strain quantum-well active layer 64 and the i-type GaAs layer 65 are not arranged in near-edge regions being located in vicinities of resonator faces and having predetermined widths, and the spaces produced by the absence of the $In_{x3}Ga_{1-x3}As_{1-y3}P_{y3}$ compressive-strain quantum-well active layer 64 and the i-type GaAs layer 65 in the near-edge regions are filled with the p-type or i-type GaAs upper optical waveguide layer 67. That is, the spaces are filled with the optical waveguide layer which has a bandgap greater than the bandgap of the $In_{x3}Ga_{1-x3}As_{1-y3}P_{y3}$ compressive-strain quantum-well active layer 64, so that a so-called window structure is realized. Thus, it is possible to suppress absorption of laser light in the vicinities of the end facets and occurrence of the COMD.

A process for producing the semiconductor laser element as the seventh embodiment is explained below.

First, the n-type $Ga_{1-z1}Al_{z1}As$ lower cladding layer 62 ($0.25 \leq z1 \leq 0.8$), the n-type or i-type GaAs lower optical waveguide layer 63, the $In_{x3}Ga_{1-x3}As_{1-y3}P_{y3}$ compressive-strain quantum-well active layer 64 ($0.49y3<x3\leq 0.4$, $0\leq y3\leq 0.1$), the i-type GaAs layer 65 (having a thickness of about 20 nm), and an $In_{0.49}Ga_{0.51}P$ second cap layer (having a thickness of about 20 nm and not being shown) are formed in this order on a (100) face of the n-type GaAs substrate 61 by organometallic vapor phase epitaxy.

Next, a resist is applied to the $In_{0.49}Ga_{0.51}P$ second cap layer, and a plurality of stripe areas of the resist extending in the $<0\bar{1}1>$ direction and being arranged at regular intervals corresponding to a predetermined resonator length are removed by conventional lithography, where each of the plurality of stripe areas of the resist has a width of about 40 micrometers. Then, a plurality of stripe regions of the $In_{0.49}Ga_{0.51}P$ second cap layer which are not covered by the remaining areas of the resist are etched off by using a hydrochloric-acid-based etching solution as an etchant and the remaining areas of the resist as a mask so as to expose a plurality of stripe regions of the i-type GaAs layer 65 under the plurality of stripe regions of the $In_{0.49}Ga_{0.51}P$ second cap layer. At this time, the etching automatically stops at the upper boundary of the i-type GaAs layer 65. After the remaining areas of the resist are removed, the plurality of stripe regions of the i-type GaAs layer 65 and a plurality of stripe regions of the $In_{x3}Ga_{1-x3}As_{1-y3}P_{y3}$ quantum-well active layer 64 under the plurality of stripe regions of the i-type GaAs layer 65 are etched off with a sulfuric-acid-based slow etching solution ($H_2SO_4:H_2O_2:H_2O=4:1:90$) until a plurality of stripe regions of the n-type or i-type GaAs lower optical waveguide layer 63 under the plurality of stripe regions of the $In_{x3}Ga_{1-x3}As_{1-y3}P_{y3}$ quantum-well active layer 64 are exposed. At this time, a portion of the n-type or i-type GaAs lower optical waveguide layer 63 may be etched. Thus, the near-edge regions of the i-type GaAs layer 65 and the $In_{x3}Ga_{1-x3}As_{1-y3}P_{y3}$ quantum-well active layer 64 (i.e., the plurality of stripe regions of the i-type GaAs layer 65 and the plurality of stripe regions of the $In_{x3}Ga_{1-x3}As_{1-y3}P_{y3}$ quantum-well active layer 64 including positions at which resonator faces are to be formed and each having a width of 40 micrometers) are removed.

Subsequently, the $In_{0.49}Ga_{0.51}P$ second cap layer is removed with a hydrochloric-acid-based etching solution, and thereafter the p-type or i-type GaAs upper optical waveguide layer 67 is formed so as to fill the spaces produced by the removal of the near-edge regions of the i-type GaAs layer 65 and the $In_{x3}Ga_{1-x3}As_{1-y3}P_{y3}$ quantum-well active layer 64. Then, the p-type $In_{0.49}Ga_{0.51}P$ first upper cladding layer 68, the GaAs etching stop layer 69, the n-type $In_{0.49}(Ga_{1-z4}Al_{z4})_{0.51}P$ current confinement layer 70 ($0\leq z4\leq 1$), the $In_{0.49}Ga_{0.51}P$ first cap layer 71, and a GaAs third cap layer (not shown) are formed on the p-type or i-type GaAs upper optical waveguide layer 67.

Thereafter, a resist is applied to the GaAs third cap layer, and a plurality of stripe areas of the resist corresponding to current injection openings of semiconductor laser elements are removed, where each of the plurality of stripe areas of the resist extends in the $<011>$ direction (which is perpendicular to the $<0\bar{1}1>$ direction), and has a width of about 1 to 3 micrometers. Then, a plurality of stripe regions of the GaAs third cap layer under the plurality of stripe areas of the resist are etched off by using a sulfuric-acid-based etching solution as an etchant and the remaining areas of the resist as a mask. At this time, the etching automatically stops at the upper boundary of the $In_{0.49}Ga_{0.51}P$ first cap layer 71. After the remaining areas of the resist are removed, a plurality of stripe regions of the $In_{0.49}Ga_{0.51}P$ first cap layer 71 under the plurality of stripe regions of the GaAs third cap layer and a plurality of stripe regions of the n-type $In_{0.49}(Ga_{1-z4}Al_{z4})_{0.51}P$ current confinement layer 70 under the plurality of stripe regions of the $In_{0.49}Ga_{0.51}P$ first cap layer 71 are etched off by using a hydrochloric-acid-based etching solution as an etchant and the remaining regions of the GaAs third cap layer as a mask. Thus, the current injection opening for each semiconductor laser element is produced. Further, the remaining regions of the GaAs third cap layer and a plurality of stripe regions of the GaAs etching stop layer 69 under the plurality of stripe regions of the n-type $In_{0.49}(Ga_{1-z4}Al_{z4})_{0.51}P$ current confinement layer 70 are removed with a sulfuric-acid-based etching solution.

Subsequently, the p-type $Ga_{1-z1}Al_{z1}As$ second upper cladding layer 73, the p-type GaAs contact layer 74, and the p electrode 75 are formed in this order on the layered structure formed as above. Then, the opposite surface of the n-type GaAs substrate 61 is polished, and the n electrode 76 is formed on the polished surface of the n-type GaAs substrate 61. Thereafter, the above layered structure is cleaved into bars each having resonator faces on opposite sides, and a high-reflection coating and a low-reflection coating are respectively applied to the opposite resonator faces of each bar. Finally, the construction illustrated in FIGS. 7A, 7B, and 7C is formed into a chip. Thus, the semiconductor laser element as the seventh embodiment is obtained.

In the above construction of the semiconductor laser element, the thickness of the p-type or i-type GaAs upper optical waveguide layer 67, the thickness of the p-type $In_{0.49}Ga_{0.51}P$ first upper cladding layer 68, and the composition of the p-type $Ga_{1-z1}Al_{z1}As$ second upper cladding layer 73 are determined so that oscillation in a fundamental transverse mode can be realized even in a high output power operation, i.e., the difference in the equivalent refractive index between the portion of the active region under the current injection window and the other portions of the active region is set in the range of about $1.5\times10^{-3}$ to $7\times10^{-3}$.

In the construction of the semiconductor laser element as the seventh embodiment, the p-type $In_{0.49}Ga_{0.51}P$ first upper cladding layer 68 may not be formed, as in the fourth embodiment. In this case, the difference in the equivalent refractive index between the portion of the active region under the current injection window and the other portions of the active region can be set to $1.5\times10^{-3}$ to $7\times10^{-3}$ by appropriately controlling the thickness of the p-type or i-type GaAs upper optical waveguide layer 67 and the thickness and composition of the p-type $Ga_{1-z1}Al_{z1}As$ second upper cladding layer 73.

Eighth Embodiment

Figure 8A:
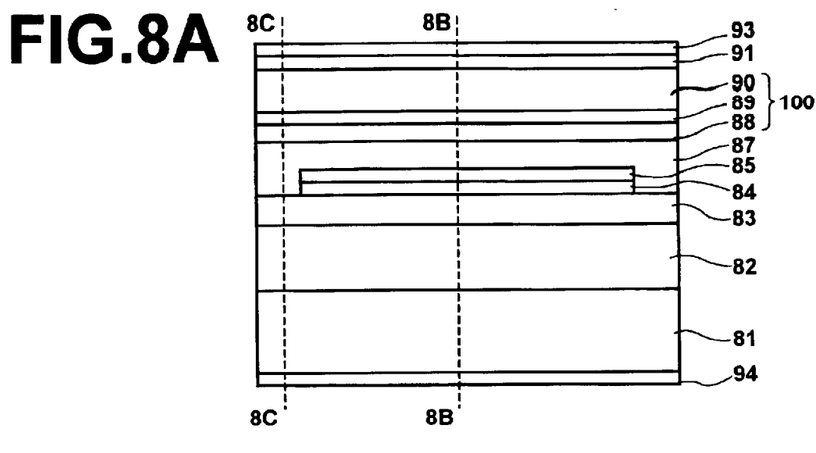
FIGS. 8A, 8B, and 8C are cross-sectional views of a semiconductor laser element as an eighth embodiment of the present invention.
Figure 8B:
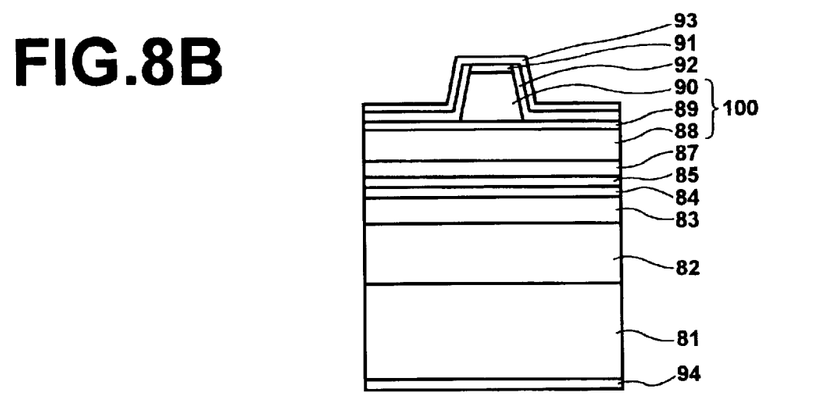
Figure 8C:
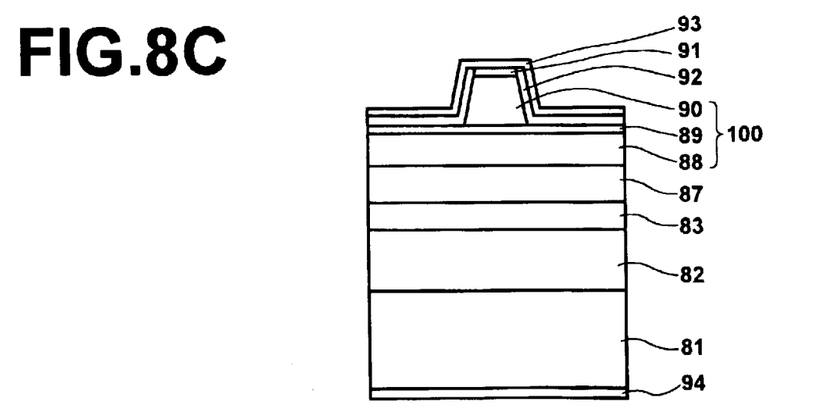

FIGS. 8A, 8B, and 8C are cross-sectional views of a semiconductor laser element as the eighth embodiment of the present invention. FIG. 8A shows a cross section parallel to the laser oscillation direction and perpendicular to the thickness direction, and FIGS. 8B and 8C respectively show the 8B—8B and 8C—8C cross sections indicated in FIG. 8A. That is, FIG. 8B shows a cross section which is located in a center portion of the semiconductor laser element and perpendicular to the laser oscillation direction, and FIG. 8C shows a cross section which is located in a vicinity of an end facet and perpendicular to the laser oscillation direction. For the same reason as the first embodiment, a construction corresponding to only one semiconductor laser element is indicated in each of FIGS. 8A to 8C for the sake of simplicity of illustration and better understanding.

In the semiconductor laser element as the eighth embodiment, an n-type $Ga_{1-z1}Al_{z1}As$ lower cladding layer 82 (0.25>z1≦0.8), an n-type or i-type GaAs lower optical waveguide layer 83, an $In_{x3}Ga_{1-x3}As_{1-y3}P_{y3}$ compressive-strain quantum-well active layer 84 (0.49y3<x3≦0.4, 0≦y3≦0.1), an i-type GaAs layer 85, a p-type or i-type GaAs upper optical waveguide layer 87, a p-type $Ga_{1-z1}Al_{z1}As$ first upper cladding layer 88, a p-type $In_{x8}Ga_{1-x8}P$ etching stop layer 89 (0≦x8≦1), a p-type $Ga_{1-z1}Al_{z1}As$ second upper cladding layer 90 having a ridge form and realizing a current path, and a p-type GaAs contact layer 91 are formed in this order on an n-type GaAs substrate 81. In addition, the semiconductor laser element as the eighth embodiment comprises a p electrode 93 formed on the p-type GaAs contact layer 91, and an n electrode 94 formed on the surface of the n-type GaAs substrate 81 opposite to the surface on which the above semiconductor layers 82 to 91 are formed. The layers from the p-type $Ga_{1-z1}Al_{z1}As$ first upper cladding layer 88 up to the p-type $Ga_{1-z1}Al_{z1}As$ second upper cladding layer 90 constitute a p-type cladding portion 100 (corresponding to the aforementioned upper cladding portion).

Further, the $In_{x3}Ga_{1-x3}As_{1-y3}P_{y3}$ compressive-strain quantum-well active layer 84 and the i-type GaAs layer 85 are not arranged in near-edge regions being located in vicinities of resonator faces and having predetermined widths, and the spaces produced by the absence of the $In_{x3}Ga_{1-x3}As_{1-y3}P_{y3}$ compressive-strain quantum-well active layer 84 and the i-type GaAs layer 85 in the near-edge regions are filled with the p-type or i-type GaAs upper optical waveguide layer 87. That is, the spaces are filled with the optical waveguide layer which has a bandgap greater than the bandgap of the $In_{x3}Ga_{1-x3}As_{1-y3}P_{y3}$ compressive-strain quantum-well active layer 84, so that a so-called window structure is realized. Thus, it is possible to suppress absorption of laser light in the vicinities of the end facets and occurrence of the COMD.

A process for producing the semiconductor laser element as the eighth embodiment is explained below.

First, the n-type $Ga_{1-z1}Al_{z1}As$ lower cladding layer 82 (0.25≦z1≦0.8), the n-type or i-type GaAs lower optical waveguide layer 83, the $In_{x3}Ga_{1-x3}As_{1-y3}P_{y3}$ compressive-strain quantum-well active layer 84 (0.49y3<x3≦0.4 and 0≦y3≦0.1), the i-type GaAs layer 85 (having a thickness of about 20 nm), and an $In_{0.49}Ga_{0.51}P$ cap layer (having a thickness of about 20 nm and not being shown) are formed in this order on a (100) face of the n-type GaAs substrate 81 by organometallic vapor phase epitaxy.

Next, a resist is applied to the $In_{0.49}Ga_{0.51}P$ cap layer, and a plurality of stripe areas of the resist extending in the <0$\bar{1}$1> direction and being arranged at regular intervals corresponding to a predetermined resonator length are removed by conventional lithography, where each of the plurality of stripe areas of the resist has a width of about 40 micrometers. Then, a plurality of stripe regions of the $In_{0.49}Ga_{0.51}P$ cap layer which are not covered by the remaining areas of the resist are etched off by using a hydrochloric-acid-based etching solution as an etchant and the remaining areas of the resist as a mask so as to expose a plurality of stripe regions of the i-type GaAs layer 85 under the plurality of stripe regions of the $In_{0.49}Ga_{0.51}P$ cap layer. At this time, the etching automatically stops at the upper boundary of the i-type GaAs layer 85. After the remaining areas of the resist are removed, the plurality of stripe regions of the i-type GaAs layer 85 and a plurality of stripe regions of the $In_{x3}Ga_{1-x3}As_{1-y3}P_{y3}$ quantum-well active layer 84 under the plurality of stripe regions of the i-type GaAs layer 85 are etched off with a sulfuric-acid-based slow etching solution ($H_2SO_4:H_2O_2:H_2O=4:1:90$) until a plurality of stripe regions of the n-type or i-type GaAs lower optical waveguide layer 83 under the plurality of stripe regions of the $In_{x3}Ga_{1-x3}As_{1-y3}P_{y3}$ quantum-well active layer 84 are exposed. At this time, a portion of the n-type or i-type GaAs lower optical waveguide layer 83 may be etched. Thus, the near-edge regions of the i-type GaAs layer 85 and the $In_{x3}Ga_{1-x3}As_{1-y3}P_{y3}$ quantum-well active layer 84 (i.e., the plurality of stripe regions of the i-type GaAs layer 85 and the plurality of stripe regions of the $In_{x3}Ga_{1-x3}As_{1-y3}P_{y3}$ quantum-well active layer 84 including positions at which resonator faces are to be formed and each having a width of 40 micrometers) are removed.

Subsequently, the $In_{0.49}Ga_{0.51}P$ cap layer is removed with a hydrochloric-acid-based etching solution, and thereafter the p-type or i-type GaAs upper optical waveguide layer 87 is formed so as to fill the spaces produced by the removal of the near-edge regions of the i-type GaAs layer 85 and the $In_{x3}Ga_{1-x3}As_{1-y3}P_{y3}$ quantum-well active layer 84. Then, the p-type $Ga_{1-z1}Al_{z1}As$ first upper cladding layer 88, the p-type $In_{x8}Ga_{1-x8}P$ etching stop layer 89 (0≦x8≦1), the p-type $Ga_{1-z1}Al_{z1}As$ second upper cladding layer 90, and the p-type GaAs contact layer 91 are formed on the p-type or i-type GaAs upper optical waveguide layer 87.

Thereafter, a first insulation film is formed on the p-type GaAs contact layer 91, and a plurality of stripe areas of the first insulation film corresponding to ridge stripes in semiconductor laser elements are removed, where each of the plurality of stripe areas of the first insulation film extends in the <0$\bar{1}$1> direction, and has a width of about 1 to 3 micrometers. Then, a plurality of stripe regions of the p-type GaAs contact layer 91 under the plurality of stripe areas of the first insulation film and a plurality of stripe regions of the p-type $Ga_{1-z1}Al_{z1}As$ second upper cladding layer 90 under the plurality of stripe regions of the p-type GaAs contact layer 91 are etched off by using a sulfuric-acid-based etching solution as an etchant and the remaining areas of the first insulation film as a mask. Thus, the ridge stripes of the semiconductor laser elements are formed. Subsequently, a second insulation film 92 is formed so as to cover the ridge portion, and an opening is produced in the second insulation film 92 at the top surface of the ridge portion. Thereafter, the p electrode 93 is formed so as to cover the opening.

Next, the opposite surface of the n-type GaAs substrate 81 is polished, and the n electrode 94 is formed on the polished surface of the n-type GaAs substrate 81. Then, the above layered structure is cleaved into bars each having resonator faces on opposite sides, and a high-reflection coating and a low-reflection coating are respectively applied to the opposite resonator faces of each bar. Finally, the construction illustrated in FIGS. 8A, 8B, and 8C is formed into a chip. Thus, the semiconductor laser element as the eighth embodiment is obtained.

In the above construction of the semiconductor laser element, the thickness of the p-type or i-type GaAs upper optical waveguide layer 87, the thickness of the p-type $Ga_{1-z1}Al_{z1}As$ first upper cladding layer 88, and the thickness and composition of the p-type $Ga_{1-z1}Al_{z1}As$ second upper cladding layer 90 are determined so that oscillation in a fundamental transverse mode can be realized even in a high output power operation, i.e., the difference in the equivalent refractive index between the portion of the active region under the ridge portion and the other portions of the active region is set in the range of about $1.5 \times 10^{-3}$ to $7 \times 10^{-3}$.

In the construction of the semiconductor laser element as the eighth embodiment, the p-type $Ga_{1-z1}Al_{z1}As$ first upper cladding layer 88 may not be formed. In this case, the difference in the equivalent refractive index between the portion of the active region under the ridge portion and the other portions of the active region can be set to $1.5 \times 10^{-3}$ to $7 \times 10^{-3}$ by appropriately controlling the thickness of the p-type or i-type GaAs upper optical waveguide layer 87 and the thickness and composition of the p-type $Ga_{1-z1}Al_{z1}As$ second upper cladding layer 90.

Additional Matters (i) The semiconductor laser devices as the third to eighth embodiments may further include first and second tensile strain barrier layers both made of $In_{x1}Ga_{1-x1}As_{1-y1}P_{y1}$ and respectively formed above and below the compressive-strain quantum-well active layer, where $0 \leq x1 < 0.49y1$ and $0 < y1 \leq 0.6$. Although the active layer in each embodiment may be a multiple-quantum-well active layer, the absolute value of the product sum of the strains and thicknesses of the compressive-strain quantum-well active layer 4 and the first and second tensile strain barrier layers should be arranged to be equal to or smaller than 0.3 nm.

(ii) In each of the processes for producing the semiconductor laser elements in the first to eighth embodiments, the slow etching solution is used for removing the near-edge portions of the active layer and the i-type GaAs layer on the active layer. Therefore, the near-edge portions can be accurately removed, i.e., an accurate window structure can be easily produced.

(iii) When the composition of the $In_{x3}Ga_{1-x3}As_{1-y3}P_{y3}$ active layer in the semiconductor laser element as each of the first to eighth embodiments of the present invention is controlled within the range of $0.49y3 < x3 \leq 0.4$ and $0 \leq y3 \leq 0.1$, the oscillation wavelength of the semiconductor laser element can be controlled in the range of 900 to 1,200 nm.

(iv) Each layer in the constructions of the first to eighth embodiments may be formed by molecular beam epitaxy using solid or gas raw material.

(v) In the constructions of the first to eighth embodiments, the subscript (such as x1 or y1) following each symbol which represents an element constituting the material of each layer is within the range of 0 to 1 unless a range of the subscript is specified. The composition of the material of each layer is appropriately determined based on a lattice matching or mismatching condition, a magnitude of a bandgap, a magnitude of a refractive index at an oscillation wavelength, and the like.

(vi) Although the n-type GaAs substrates are used in the constructions of the first to eighth embodiments of the present invention, instead, p-type GaAs substrates may be used. When the GaAs substrate in the construction of each embodiment is a p-type, the conductivity types of all of the other layers in the construction should be inverted.

(vii) The semiconductor laser elements as the first to eighth embodiments can generate laser light with high output power while maintaining a fundamental transverse mode. The present invention can be applied to semiconductor laser elements which include an emission region having a width of 3 micrometers or greater and oscillate in multiple modes, as well as the semiconductor laser elements which oscillate in a fundamental transverse mode. That is, it is possible to obtain reliable semiconductor laser elements which oscillate in multiple modes with low noise and high output power.

What is claimed is:

1. A semiconductor laser element having opposite end facets which realize a resonator, comprising:

a substrate of GaAs of a first conductive type;

a lower cladding layer of the first conductive type, formed above said GaAs substrate;

a first optical waveguide layer being made of GaAs of the first conductive type or an undoped type, having a first bandgap, and being formed above said lower cladding layer;

an active layer being made of one of InGaAsP and InGaAs, having a compressive strain and a second bandgap smaller than said first bandgap, and being formed above said first optical waveguide layer so as to leave at least one first space in at least one first vicinity of at least one of said opposite end facets;

a second optical waveguide layer being made of GaAs of a second conductive type or an undoped type, having a third bandgap greater than said second bandgap, and being formed above said active layer;

a third optical waveguide layer being made of GaAs of said second conductive type or an undoped type, having a fourth bandgap greater than said second bandgap, and filling said at least one first space; and an upper cladding portion formed above said third optical waveguide layer.

2. A semiconductor laser element according to claim 1, wherein said active layer is made of $In_{x3}Ga_{1-x3}As_{1-y3}P_{y3}$, where $0.49y3 < x3 \leq 0.4$ and $0 \leq y3 \leq 0.1$.

3. A semiconductor laser element according to claim 1, further comprising, a contact layer of the second conductive type formed above said upper cladding portion so as to leave at least one second space in at least one second vicinity of said at least one of said opposite end facets, and an electrode formed on said contact layer.

4. A semiconductor laser element according to claim 3, further comprising an insulation film formed in aid at least one second space above said upper cladding portion, and said electrode is formed on said insulation film as well as the contact layer.

5. A semiconductor laser element according to claim 1, wherein said upper cladding portion includes a ridge portion, said ridge portion being shaped as a raised stripe extending between said opposite end facets, a top of the ridge portion being higher in elevation relative to areas of the upper cladding portion at both lengthwise sides of the raised stripe shape of the ridge portion.

6. A semiconductor laser element according to claim 1, wherein said upper cladding portion comprises, a first etching stop layer made of GaAs of the second conductive type, a second etching stop layer being made $In_{x8}Ga_{1-x8}P$, having a first stripe opening for current injection and being formed above said first etching stop layer, where $0 \leq x8 \leq 1$, a current confinement layer being made of $Ga_{1-z2}Al_{z2}As$ of the first conductive type, having a second stripe opening for current injection, and being formed above said second etching stop layer, a cap layer being made of GaAs, having a third stripe opening for current injection, and being formed above said current confinement layer, and a first upper cladding layer of the second conductive type formed above said cap layer, where said first, second, and third stripe openings extend between said opposite end facets.

7. A semiconductor laser element according to claim 6, wherein said lower cladding layer and said first upper cladding layer are made of one of AlGaAs, InGaAlP, and InGaAlAsP which lattice-matches with said substrate.

8. A semiconductor laser element according to claim 6, wherein said upper cladding portion further comprises a second upper cladding layer of the second conductive type formed under said first etching stop layer.

9. A semiconductor laser element according to claim 8, wherein said lower cladding layer, said first upper cladding layer, and said second upper cladding layer are made of one of AlGaAs, InGaAlP, and InGaAlAsP which lattice-matches with said substrate.

10. A semiconductor laser element according to claim 6, wherein said first upper cladding layer of the second conductive type is made of $Ga_{1-z1}Al_{z2}As$, where $0.2S \leq z1 \leq 0.8$, and wherein for said current confinement layer made of $Ga_{1-z2}Al_{z2}As$ of the first conductive type, $z2>z1$.

11. A semiconductor laser element according to claim 1, wherein said upper cladding portion comprises, a first etching stop layer made of $In_{x8}Ga_{1-z4}P$ of the second conductive type, where $0 \leq x8 \leq 1$, a second etching stop layer being made of GaAs, having a first stripe opening for current injection, and being formed above said first etching stop layer, a current confinement layer being made of $In_{0.49}(Ga_{1-z4}Al_{z4})_{0.51}P$ of the first conductive type, having a second stripe opening for current injection, and being formed above said second etching stop layer, where $0 \leq z4 \leq 1$, a cap layer being made of $In_{0.49}Ga_{0.51}P$ of the first conductive type, having a third, stripe opening for current injection, and being formed above said current confinement layer, and a first upper cladding layer of the second conductive type formed above said cap layer, where said first, second, and third stripe openings extend between said opposite end facets.

12. A semiconductor laser element according to claim 11, wherein said lower cladding layer and said first upper cladding layer are made of one of AlGaAs, InGaAlP, and InGaAlAsP which lattice-matches with said substrate.

13. A semiconductor laser element according to claim 11, wherein said upper cladding portion further comprises a second upper cladding layer of the second conductive type formed under said first etching stop layer.

14. A semiconductor laser element according to claim 13, wherein said lower cladding layer, said first upper cladding layer, and said second upper cladding layer are made of one of AlGaAs, InGaAlP, and InGaAlAsP which lattice-matches with said substrate.

15. A semiconductor laser element according to claim 1, wherein said upper cladding portion comprises, a first upper cladding layer being made of $In_{0.49}Ga_{0.51}P$ of the second conductive type, an etching stop layer being made of GaAs, having a first stripe opening for current injection, and being formed above said first upper cladding layer, a current confinement layer being made of $In_{0.49}(Ga_{1-z4}Al_{z4})_{0.51}P$ of the first conductive type, having a second stripe opening for current injection, and being formed above said etching stop layer, where $0 \leq z4 \leq 1$ a cap layer being made of $In_{0.49}Ga_{0.51}P$, having a third stripe opening for current injection, and being formed above said current confinement layer, and a second upper cladding layer of the second conductive type formed above said cap layer, where said first, second, and third stripe openings extend between said opposite end facets.

16. A semiconductor laser element according to claim 15, wherein said lower cladding layer, said first upper cladding layer, and said second upper cladding layer are made of one of AlGaAs, InGaAlP, and InGaAlAsP which lattice-matches with said substrate.

17. A semiconductor laser element according to claim 1, further comprising tensile-strain barrier layers respectively formed between said first optical waveguide layer and said active layer and between said active layer and said second optical waveguide layer and made of $In_{x1}Ga_{1-x1}As_{1-y1}P_{y1}$, where $0 \leq x1 \leq 0.49y1$ and $0<y1 \leq 0.6$.

18. A semiconductor laser element according to claim 1, wherein said first optical waveguide layer is formed directly on, physically connected to, said lower cladding layer; and wherein said active layer is formed directly on, physically connected to, said first optical waveguide layer.

* * * * *